(12) United States Patent
Matsui et al.

(10) Patent No.: US 6,522,590 B2
(45) Date of Patent: Feb. 18, 2003

(54) SEMICONDUCTOR MEMORY DEVICE

(75) Inventors: Yoshinori Matsui, Tokyo (JP); Hiroaki Ikeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/783,109

(22) Filed: Feb. 14, 2001

(65) Prior Publication Data

US 2001/0040830 A1 Nov. 15, 2001

(30) Foreign Application Priority Data

Feb. 16, 2000 (JP) ........................................ 2000-038617

(51) Int. Cl.[7] ................................................. G11C 7/00
(52) U.S. Cl. ................................... 365/200; 365/230.03
(58) Field of Search ............................. 365/200, 230.03

(56) References Cited

U.S. PATENT DOCUMENTS

| 4,380,066 A | * | 4/1983 | Spencer et al. ............... 365/200 |
| 4,941,088 A | * | 7/1990 | Shaffer et al. ............... 365/200 |
| 5,307,316 A | * | 4/1994 | Takamae ..................... 365/200 |
| 5,835,425 A | * | 11/1998 | Berger ......................... 365/200 |

FOREIGN PATENT DOCUMENTS

| JP | 2000-260197 | 9/2000 |

* cited by examiner

Primary Examiner—Son T. Dinh
(74) Attorney, Agent, or Firm—Katten Muchin Zavis Rosenman

(57) ABSTRACT

A semiconductor memory device, that uses redundant memory cell clusters sharing one data transfer bus line to perform defect recovery for a plurality of defects, and provides an improved rate of recovery. The semiconductor memory device is formed from a main memory, a sub-memory functioning as cache memory, and a plurality of data transfer bus lines, which are configured so that data can be transferred bi-directionally between said main memory and said sub-memory; and performs defect recovery for defects located in said main memory based on an address signal (sub-memory column selecting signal SYm) for said sub-memory and address signals (main memory row selecting signal DXn and bank selecting signal BS) in said main memory, which correspond to said address.

23 Claims, 16 Drawing Sheets

FIG. 10

| FUNCTION | SYMBOL | CKE n-1 | CKE n | /CS | /RAS | /CAS | /WE | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|---|---|---|---|
| CHANNEL READ | READ | H | x | L | H | L | H | BANK | CHANNEL | CHANNEL | ROW CHANNEL | ROW CHANNEL | | X | COLUMN ADDRESS | | | | | | |
| CHANNEL WRITE | WRITE | H | x | L | H | L | L | BANK | CHANNEL | CHANNEL | ROW CHANNEL | ROW CHANNEL | | X | COLUMN ADDRESS | | | | | | |
| BANK ACTIVATE | ACT | H | x | L | L | H | H | BANK | ROW ADDRESS | | | | | | | | | | | | |

H: HIGH LEVEL
L: LOW LEVEL
x: HIGH OR LOW (DON'T CARE)

SEMICONDUCTOR MEMORY DEVICE

BACKGROUND OF THE INVENTION

1. Field of the Invention

The present invention relates to a semiconductor memory device in which sub-memories such as SRAM (static RAM) are used as cache memory on the same semiconductor substrate as is formed the main memory such as DRAM, and in which it is possible to configure bi-directional data transfer bus lines between the main memory and sub-memory. In particular, it relates to redundancy configurations for performing defect recovery in the main memory.

2. Description of the Related Art

Generally, memory devices (main memory) used by computer systems are relatively slow, inexpensive semiconductor devices with large capacities, and quite often the general-purpose DRAM (dynamic RAM) does not meet user demands. In recent years, in order to speed up the computer systems (especially speed up the MPU), attempts have been made to speed up the DRAM forming the main memory. However, since it alone is not enough to speed up the MPU (microprocessor unit), it has become common practice to configure a high-speed memory region as sub-memory between the MPU and the main memory. High speed SRAM (static RAM) and ECLRAM (emitter coupled logic RAM) have been commonly used for this type of sub-memory, which is also referred to as cache memory.

This sub-memory can be mounted outside of the MPU or can be internalized in the MPU, however, semiconductors having the main memory formed from DRAM and the sub-memory formed from SRAM mounted on the same semiconductor substrate have been noticed recently, for example, as shown in Japanese Patent Application No. Hei 11-64094 (Japanese Patent Application Laid-open No. 2000-260197). With the conventional technology in this semiconductor memory device, data transfer bus lines are used to connect the memory cell arrays of the sub-memory and the memory cell array of the main memory and via these data transfer bus lines it is possible to directly connect the main memory and sub-memory.

This type of semiconductor memory device will now be briefly summarized while referencing FIG. 2. The semiconductor memory device shown in FIG. 2 is comprised of main memory-memory cell arrays 110-1 to 110-4, which form the main memory, and sub-memory-memory cell arrays 120-1 and 120-2, which form the sub-memory, and contains a x8 bit synchronous interface. In this example, main memory is formed into two banks, main memory-memory cell array 110-1 and main memory-memory cell array 110-4 form bank A, and main memory-memory cell array 110-2 and main memory-memory cell array 110-3 form bank B.

In addition, 512 data transfer bus lines TBL (TBL1 to TBL512) are configured crossing main memory-memory cell arrays 110-1 and 110-2, and sub-memory-memory cell array 120-1. These data transfer bus lines TBL facilitate the transfer of data between the main memory-memory cell clusters and sub-memory-memory cell clusters, so that, data in, for example, one column of sub-memory cell clusters can be transferred to four columns of main memory cell clusters via one data transfer bus line. Data transfer bus lines TBL (TBL513 to TBL1024) are configured in the same manner, crossing main memory-memory cell arrays 110-3 and 110-4, and sub-memory-memory cell array 120-2. In this example 1024 bits of transfer data can be transferred via data transfer bus lines TBL1 to TBL1024 at one time.

It should be noted here that in the semiconductor memory device formed with the configuration mentioned above, there are redundant memory cell arrays formed in each of the respective main memory-memory cell arrays and sub-memory-memory cell arrays. Data transfer bus lines connect memory cell clusters in the redundant main memory-memory cell arrays and memory cell clusters in the redundant sub-memory-memory cell arrays, in the same manner as the normal memory cell clusters are connected.

Furthermore, when performing defect recovery in the main memory-memory cell array, the memory cell clusters travel along the data transfer bus lines as units, so that each memory cell cluster of the main memory-memory cell arrays and sub-memory-memory cell arrays are substituted by the redundant memory cell cluster in one lump.

However, according to this technique, in order for the memory cell clusters traveling along data transfer bus lines to be replaced, all of the redundant memory cell clusters traveling along the transfer data bus lines are used for as little as one spot of defect recovery, leading to a low rate of recovery.

SUMMARY OF THE INVENTION

The present invention, in consideration of the above problems, aims to provide a semiconductor device that can use redundant memory cell clusters along data transfer bus lines to recover a plurality of defects with an improved rate of recovery.

In order to solve the above problems, the present invention has the following structures. Namely, the semiconductor memory device according to claim 1 of the present invention is a semiconductor memory device comprised of main memory (for example, the component corresponding to main memory 101, described below), sub-memory (for example, the component corresponding to sub-memory 102, described below), and data transfer bus lines (for example, the components corresponding to data transfer bus lines TBL, described below), which are configured so that bi-directional data transfer can occur between said main memory and said sub-memory via said data transfer bus lines. This semiconductor memory device is further comprised of a redundant circuit, which, during a read-out or write operation, determines an address to be replaced, by referencing the main memory address (for example, the signal component corresponding to main memory row selecting signal DXn, described below) corresponding to certain designated external data in the sub-memory, and then performs defect recovery for defects located in said main memory based on said resultant determination. This redundant circuit is comprised of, for example, the components corresponding to redundant main memory-memory cell array DMAR, redundant data transfer bus lines TBLR1 and TBLR2, redundant sub-memory-memory cell array SMAR, redundant global data input/output lines GIOR, redundant data input/output lines SIOR, redundant data input line connection circuits 155R1 and 155R2, redundant read/write amplifier 153R, and address-substituting determination circuits 2001 and 2002, described below.

Furthermore, the semiconductor memory device according to claim 2 of the present invention, is a semiconductor memory device comprised of a main memory (for example the component corresponding to main memory 101, described below), a sub-memory (for example the component corresponding to sub-memory 102, described below) and a plurality of data transfer bus lines (for example the component corresponding to data transfer bus lines TBL, described below), which are configured so that data can be transferred bi-directionally between said main memory and said sub-memory. This semiconductor memory device is further comprised of a redundant circuit, which determines an address to be substituted based on an address (for example the signal component corresponding to sub-memory column selecting signal SYm, described below) designated in said sub-memory by an external component during either read-out or writing and an address in said main memory (for example the signal component corresponding to main memory row selecting signal DXn, described below), which corresponds to said address, and then performs defect recovery for defects located in said main memory based on the result of said determination. This redundant circuit is comprised of, for example, the components corresponding to redundant main memory-memory cell array DMAR, redundant data transfer bus lines TBLR1 and TBLR2, redundant sub-memory-memory cell array SMAR, redundant global data input/output lines GIOR, redundant data input/output lines SILR, redundant data input line connection circuits 155R1 and 155R2, redundant read/write amplifier 153R, and address-substituting determination circuits 2001 and 2002, described below.

Furthermore, in the semiconductor device according to claim 3 of the present invention is the semiconductor memory device mentioned in any of claims 1 and 2, the said redundant circuit is comprised of at least one redundant main memory-memory cell array (for example, the component corresponding to redundant main memory-memory cell array DMAR, described below) formed in said main memory; at least one redundant sub-memory-memory cell array (for example, the component corresponding to redundant sub-memory-memory cell array SMAR, described below) formed in said sub-memory; redundant transfer data bus lines (for example the component corresponding to redundant data transfer bus lines TBLR1 and TBLR2, described below), which connect said redundant main memory-memory cell array and said redundant sub-memory-memory cell array, and which are configured so that data can be transferred bi-directionally between said redundant main memory-memory cell array and said redundant sub-memory-memory cell array; and, at least one address-substituting determination element (for example the component corresponding to address-substituting determination circuits 2001 and 2002, described below), which determines said address to be substituted. This redundant circuit selects said redundant sub-memory-memory cell array based on the result of said determination by said address-substituting determination element.

Furthermore, the semiconductor memory device according to claim 4 of the present invention is the semiconductor memory device mentioned in any of claims 1 through 3 wherein said address in main memory is a memory cell cluster formed in said main memory, which shares said data transfer bus lines, and is divided into a plurality of groups, and which is an address (for example, the signal components corresponding to main memory row selecting signal DXn, bank selecting signal BS, and segment selecting signals SEG1 to SEG4, described below) which designates one of said plurality of groups.

Furthermore, the semiconductor memory device according to claim 5 of the present invention, is the semiconductor memory device mentioned in claim 4, wherein said main memory address is an address (for example the signal component corresponding to main memory row selecting signal DXn, described below), which selects a certain row in said main memory.

Furthermore, the semiconductor memory device claim 6 of the present invention is the semiconductor memory device mentioned in claim 4, wherein said main memory address is an address (for example the signal component corresponding to bank selecting signal BS, described below), which selects a certain row in said main memory.

Furthermore, the semiconductor memory device according to claim 7 of the present invention is the semiconductor memory device mentioned in claim 4, wherein said main memory address is an address (for example the signal component corresponding to segment selecting signals SEG1 to SEG4, described later), which selects a certain segment in said memory.

The semiconductor memory device according to claim 8 of the present invention is the semiconductor memory device mentioned in any of claims 1 through 7, which is further comprised of a hold circuit (for example the component corresponding to main memory address information hold circuit 3000, described below), which holds said main memory address and supplies said main memory address to said redundant circuit.

BRIEF DESCRIPTION OF DRAWINGS

The above and other objects, features and advantages of present invention will become more apparent from the following detailed description, when taken in conjunction with the accompanying drawings, wherein:

FIG. 10 shows a table that explains the settings for signals to be input to the sub-memory, according to the first embodiment of the present invention.

DETAILED DESCRIPTION OF THE PREFERRED EMBODIMENTS

The preferred embodiments of the present invention will now be described while referencing the drawings.

(First Embodiment)

Figure 1:
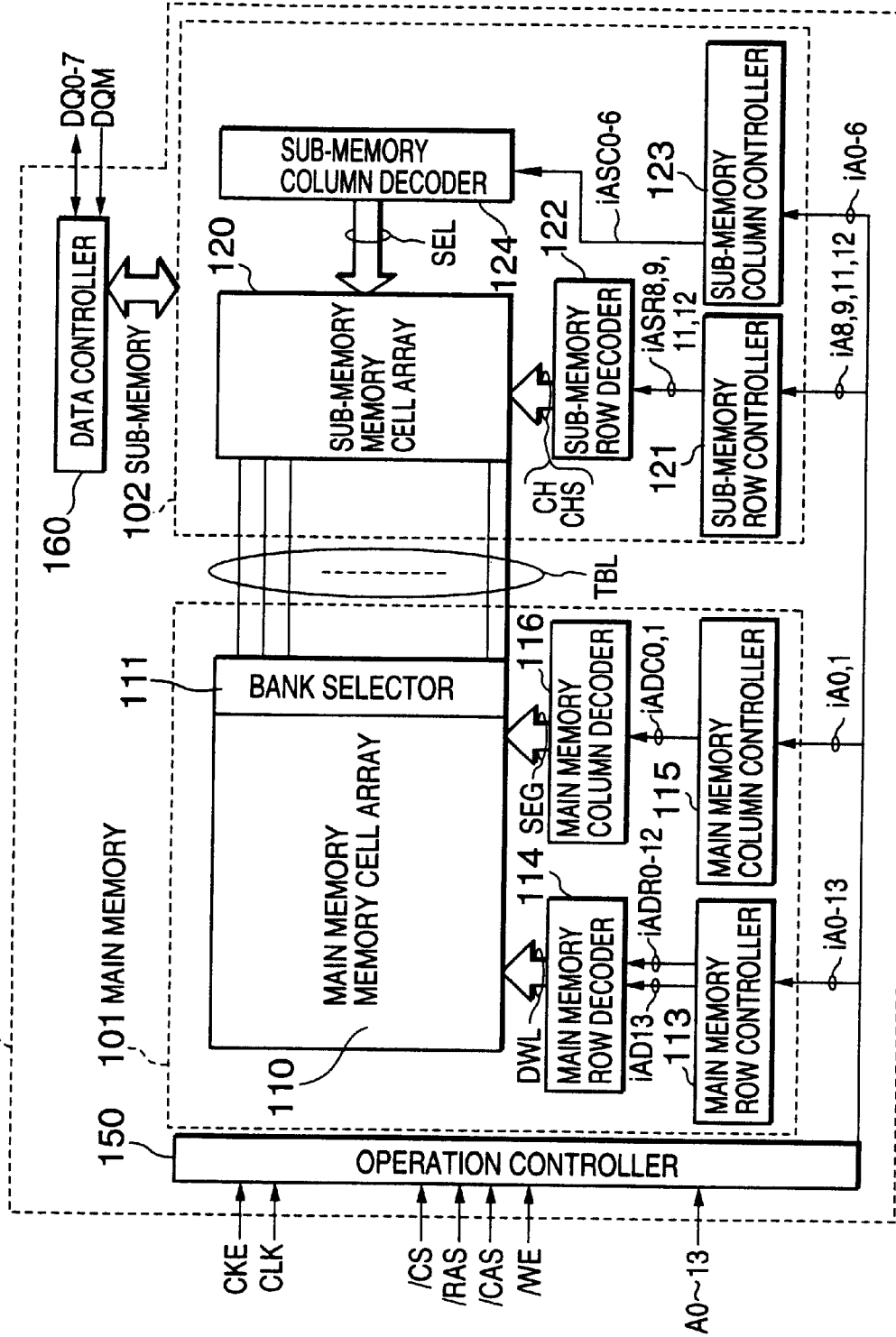
FIG. 1 is a block diagram showing an overview of the full semiconductor memory device, according to a first embodiment of the present invention.

A general overview of the full semiconductor memory device, according to the present invention, is shown in FIG. 1. As shown in FIG. 1, semiconductor memory device 100 is comprised of main memory 101; sub-memory 102; data transfer bus lines TBL; operation controller 150, which controls the internal operation of the device by receiving external signals and then generating the appropriate internal address signals iA0 to iA13; and data controller 160, which controls the input/output of data to/from an external component. The semiconductor memory device 100 is formed to allow bi-directional data transfer between main memory 101 and sub-memory 102 via data transfer bus lines TBL. Each respective data transfer bus line TBL is formed from a pair of bus lines for each complementary piece of data to be transferred. In the following explanation, it should be noted that when the term data transfer bus line is used, it actually refers to a pair of bus lines.

In this first embodiment, main memory 101 is comprised of 64 Mb of synchronous DRAM (dynamic RAM) in two banks A and B, and sub-memory 102 is comprised of 16 Kb of SRAM (static RAM) having a ×8 bit structured synchronous interface. The terms "dynamic RAM" and "static RAM" are used solely as terms referring to forms of data storage, but it does not necessarily mean that they have the same structure as commercially available ready-made memory. Furthermore, in this first embodiment, DRAM is used for the main memory and SRAM is used for the sub-memory, however the present invention is not limited to this; other forms of memory may alternately be used.

Semiconductor memory device 100 is further comprised of redundant circuits (defect recovery circuits) in order to allow for recovery of defects within the main memory 101, which will be described later on. These redundant circuits, during read or write operations, determine which addresses should be replaced by referring to the address in main memory 101 corresponding to the data in the sub-memory 102 that has been designated by the external component, and then based on the resultant determination, recovers the defect in the main memory 101. These redundant circuits also, during read or write operations, can be said to perform defect recovery in main memory 101 by determining which address should be replaced based on the address designated in sub-memory 102 by the external component and the address in the main memory corresponding to said designated address in sub-memory 102.

Main memory 101 is comprised of main memory-memory cell array 110, which is comprised of 64 Mb of dynamic memory cells laid out in a matrix with two banks, bank A and bank B; bank selector 111, which selects either bank A or bank B; main memory row controller 113 and main memory row decoder 114, which are a string of circuits that select a bank and row in main memory-memory cell array 110; and, main memory column controller 115 and main memory column decoder 116, which are a string of circuits that select the segment (described later) formed from a certain column in main memory-memory cell array 110.

Bank selector 111 selects bank A or bank B within the memory cell array based on bank address signal iAD13 (A13) and connects it with data transfer bus lines TBL. Main memory row controller 113 receives internal address signals iA0 to iA13 and generates main memory row selecting signals iADR0 to iADR12 and bank address signal iAD13. Main memory row decoder 114 receives main memory row selecting signals iADR0 to iADR12 and bank address signal iAD13 and selects the word line DWL of the corresponding row. Main memory column controller 115 receives internal addresses iA0 and iA1 and generates segment address signals iADC0 and iADC1. Main memory column decoder 116 receives segment address signals iADC0 and iADC1, selects the corresponding column, and then generates segment selecting signals SEG(SEG1 to SEG4) in order to select a certain segment (described later).

Sub-memory 102 is comprised of sub-memory-memory cell array 120, which contains 16 Kb of static memory cells laid out in a matrix; sub-memory row controller 121 and sub-memory row decoder 122, which are a string of circuits that select a certain row in sub-memory-memory cell array 120; and, sub-memory column controller 123 and sub-memory column decoder 124, which are a string of circuits that select a certain column in sub-memory-memory cell array 120.

Sub-memory row controller 121 receives internal address signals iA8, iA9, ia11 and iA12, and generates sub-memory row selecting signals iASR8, iASR9, iASR11, and iASR12. Sub-memory row decoder 122 receives sub-memory row selecting signals iASR8, iASR9, iASR11 and iASR12 and then selects the corresponding row in sub-memory-memory cell array 120. Sub-memory column controller 123 receives internal address signals iA0 to iA6 and then generates sub-memory column selecting signals iASC0 to iASC6. Sub-memory column decoder 124 receives sub-memory column selecting signals iASC0 to iASC6 and then selects the corresponding column in sub-memory-memory cell array 120.

Next, the signals sent from the external component to semiconductor memory device 100 and the principal commands for controlling its basic operation will be briefly described. Clock signal CLK is the standard signal on which all the other signals are based. Chip selector signal/CS is a signal that determines whether or not the other signals should be received. Row address strobing signal/RAS, column address strobing signal/CAS, and write-enable signal/WE are grouped together and are a controlling signal that controls operations such as read-out and write. Address signals A0 to A13 (note that of these, signal A7 is not used) are signals that specify the location of certain data within main memory 101 and sub-memory 102. Data mask signal DQM is a signal for invalidating (masking) the data input or output based on its bit count. Data signals DQ0 to DQ7 are the signals of data that are input/output to/from the semiconductor memory device.

Although it is not specifically shown in FIG. 1, in addition to the above signals, there are various commands CMD that are input from the external component for controlling basic functions. For example, the read command is a command for reading-out data DQ0 to DQ7 from sub-memory 102 to the external component. Within this command, address signals A8, A9, A11, and A12 designate the address of a certain row in sub-memory 102. The write command is a command for writing data DQ0 to DQ7 into sub-memory 102. Within this command, address signals A8, A9, A11, and A12 designate the address of a certain row in sub-memory 102 and address signals A0 to A6 designate the address of a certain column of sub-memory 102.

The pre-fetch command is a command that transfers data from the main memory 101 to the sub-memory 102. Within this command, address signals A8, A9, A11, and A12 designate the address of a certain row in sub-memory 102; A0 and A1 designate the address of a certain column in main memory 101 (or a segment address); and address signal A13 designates the address for selecting a certain bank (or bank address).

The list command is the command that transfers data from the sub-memory 102 to main memory 101. Within this command address signals A8, A9, A11, and A12 designate the address of a certain row in the transfer-origin, sub-memory 102; address signals A0 and A1 designate the address of a certain column in the transfer-destination, main memory 101 (or a segment address), and address signals A0 to A12 designate a certain row in the transfer-destination, main memory 101; and address signal A13 designates an address for selecting a certain bank (or bank address).

Activation command is the command that activates one of the banks of the main memory 101, and selects one row of memory cells within one of the banks, amplifying that data. Within this command, address signal A13 designates an address for selecting a certain bank in main memory 101, and address signals A0 to A12 designate the address of a certain row in main memory 101.

Figure 2:
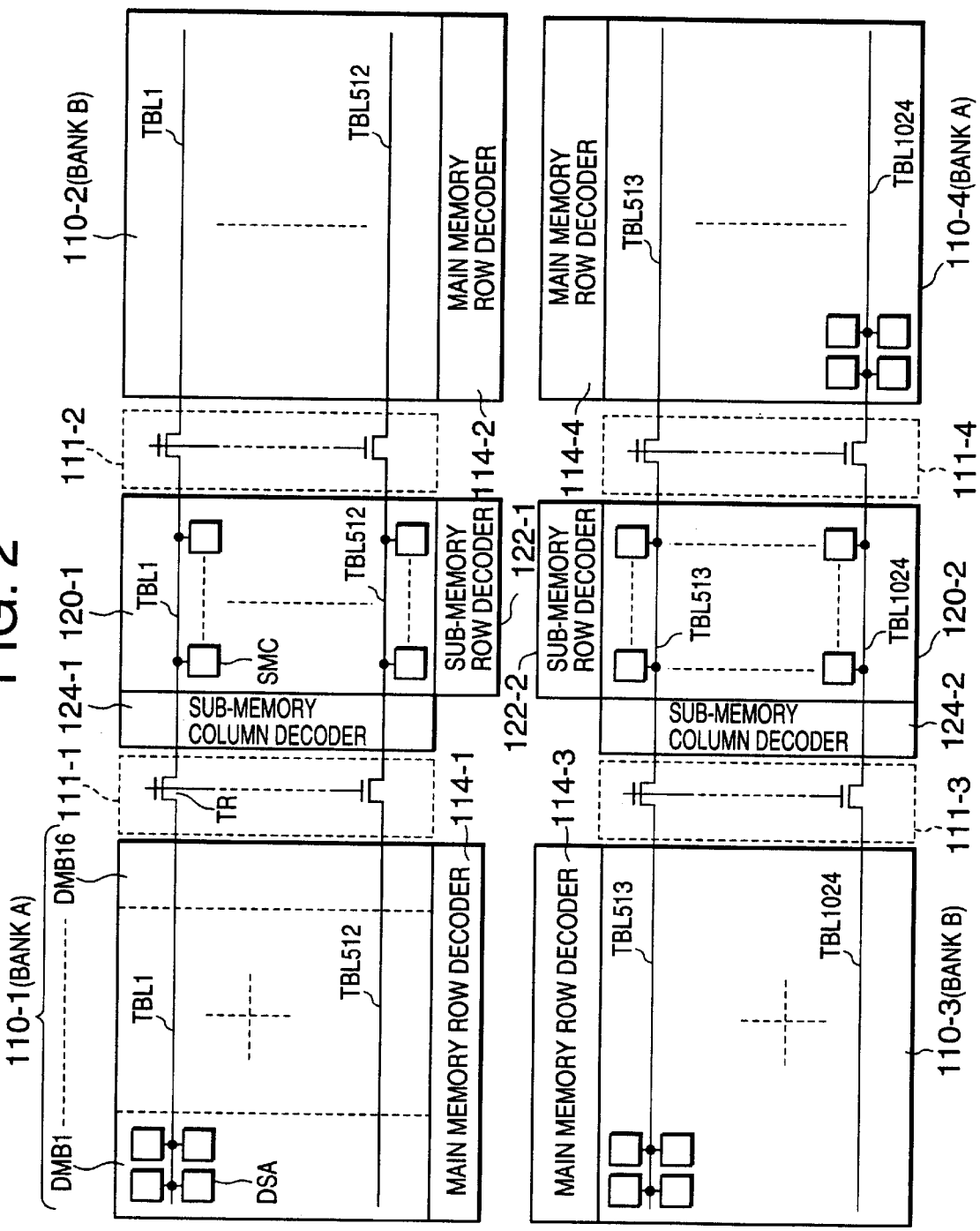
FIG. 2 shows a general overview of the full chip layout in the semiconductor memory device, according to the first embodiment of the present invention.

FIG. 2 shows a general overview of the full chip layout in the semiconductor memory device, according to the first embodiment of the present invention. As shown in FIG. 2, on the chip are positioned main memory-memory cell arrays 110-1 to 110-4, which correspond to main memory-memory cell array 110 shown in FIG. 1; sub-memory-memory cell arrays 120-1 and 120-2, which correspond to sub-memory-memory cell array 120 in FIG. 1; and bank selectors 111-1 to 111-4, which correspond to bank selector 111 in FIG. 1.

In this example, main memory-memory cell arrays 110-1 and 110-4 form bank A, and main memory-memory cell arrays 110-2 and 110-3 form bank B. Each respective main memory-memory cell array 110-1 to 110-4 is formed from 16M of dynamic memory laid out in a 8192 row by 2048 column matrix, and divided into memory cell blocks DMB1 to DMB16. Main memory row decoders 114-1 to 114-4 are formed in main memory-memory cell arrays 110-1 to 110-4, respectively, forming the main memory row decoder 114 shown in FIG. 1.

Sub-memory-memory cell array 120-1 is formed between main memory-memory cell arrays 110-1 and 110-2, and is comprised of 8 Kb of static memory cells SMC arranged in a 512 row by 16 column matrix. Sub-memory row decoder 122-1 and sub-memory column decoder 124-1 are formed within this sub-memory-memory cell array 120-1.

In the same fashion, sub-memory-memory cell array 120-2 is formed between main memory-memory cell arrays 110-3 and 110-4; and sub-memory row decoder 122-2 and sub-memory column decoder 124-2 are formed within this sub-memory-memory cell array 120-2. Sub-memory row decoders 122-1 and 122-2 form sub-memory row decoder 122 shown in FIG. 1; and sub-memory column decoders 124-1 and 124-2 form sub-memory column decoder 124, also in FIG. 1.

Furthermore, transfer data bus lines TBL1 to TBL512, which correspond to the columns of sub-memory-memory cell array 120-1, are laid out crossing main memory-memory cell array 110-1 (in bank A), sub-memory-memory cell array 120-1, and main memory-memory cell array 110-2 (in bank B); bank selectors 111-1 and 111-2 are then inserted on top of these data transfer bus lines.

Data transfer bus lines TBL1 to TBL512 are formed so that they transfer data directly between the main memory-memory cell cluster selected by main memory row decoder 114-1 or 114-2, and the sub-memory-memory cell cluster selected by sub-memory row decoder 122-1 and sub-memory column decoder 124-1. A certain memory cell cluster in one of the banks is selected by bank selectors 111-1 or 111-2, based on address signal A13, and connected to the appropriate sub-memory-memory cell cluster.

In the same fashion, data transfer bus lines TBL513 to TBL1024, which correspond to the columns of sub-memory-memory cell array 120-2, are laid out crossing main memory-memory cell array 110-3 (in bank B), sub-memory-memory cell array 120-2, and main memory-memory cell array 110-4 (in bank A); bank selectors 111-3 and 111-4 are then inserted on top of these data transfer bus lines.

As it is described later in the specification, 4 sense amplifiers DSA are formed in each memory cell block DMB1 to DMB16 that form, for example, main memory-memory cell array 110-1, and 4 columns worth of memory cells (8192 cells×4 columns) are connected via these sense amplifiers. In addition, one column worth of memory cells (16 cells) in the sub-memory-memory cell array are connected by one line of data transfer bus line.

In this example, one of main memory-memory cell arrays 110-1 or 110-4 in bank A or main memory-memory cell arrays 110-2 or 110-3 in bank B is selected for data transfer bus lines TBL1 to TBL 1024 by bank selectors 111-1 to 111-4, and a total of 1024 bits of data are simultaneously transferred between sub-memory 102 and either bank A or bank B of main memory 101.

At this point, in sub-memory 102, the 1024 (512 columns×2) memory cells along the same line in sub-memory-memory cell array 120 that has been selected by sub-memory row decoder 122, are each connected to their respective data transfer bus line TBL1 to TBL1024. Also, in main memory 101, the 1024 (512 columns×2) memory cells along the same line in main memory-memory cell array 110, which has been selected by main memory row decoder 114, and which are memory cells lying along a line connected to one of the 4 sense amplifiers DSA (which of the 4 sense amplifiers is chosen is determined by address signals A0 and A1), are each connected to their respective data transfer line TBL1 to TBL1024. As a result, it is possible to simultaneously transfer 1024 bits of data between main memory 101 and sub-memory 102.

In the following explanation, the set of 1024 bits of data stored in a certain memory cell cluster in main memory 101 and selected based on address signals A0 and A1 is referred to as a segment; and the memory cell cluster containing the corresponding 1024 bits of data in sub-memory 102 that has been selected based on address signals A8, A9, A11, and A12 are referred to as a channel. With this first embodiment, since sub-memory 102 is comprised of a 16 row by 1024 column sub-memory-memory cell array 120, it is possible to simultaneously transfer one segment of data (1024 bits) that has been selected by address signals A8, A9, A11, and A12 via the channel that has been selected by address signals A0 and A1; therefore, by applying the segment selecting signals SEG1 to SEG4, one right after the other, it is possible to transfer four consecutive segments.

Figure 3:
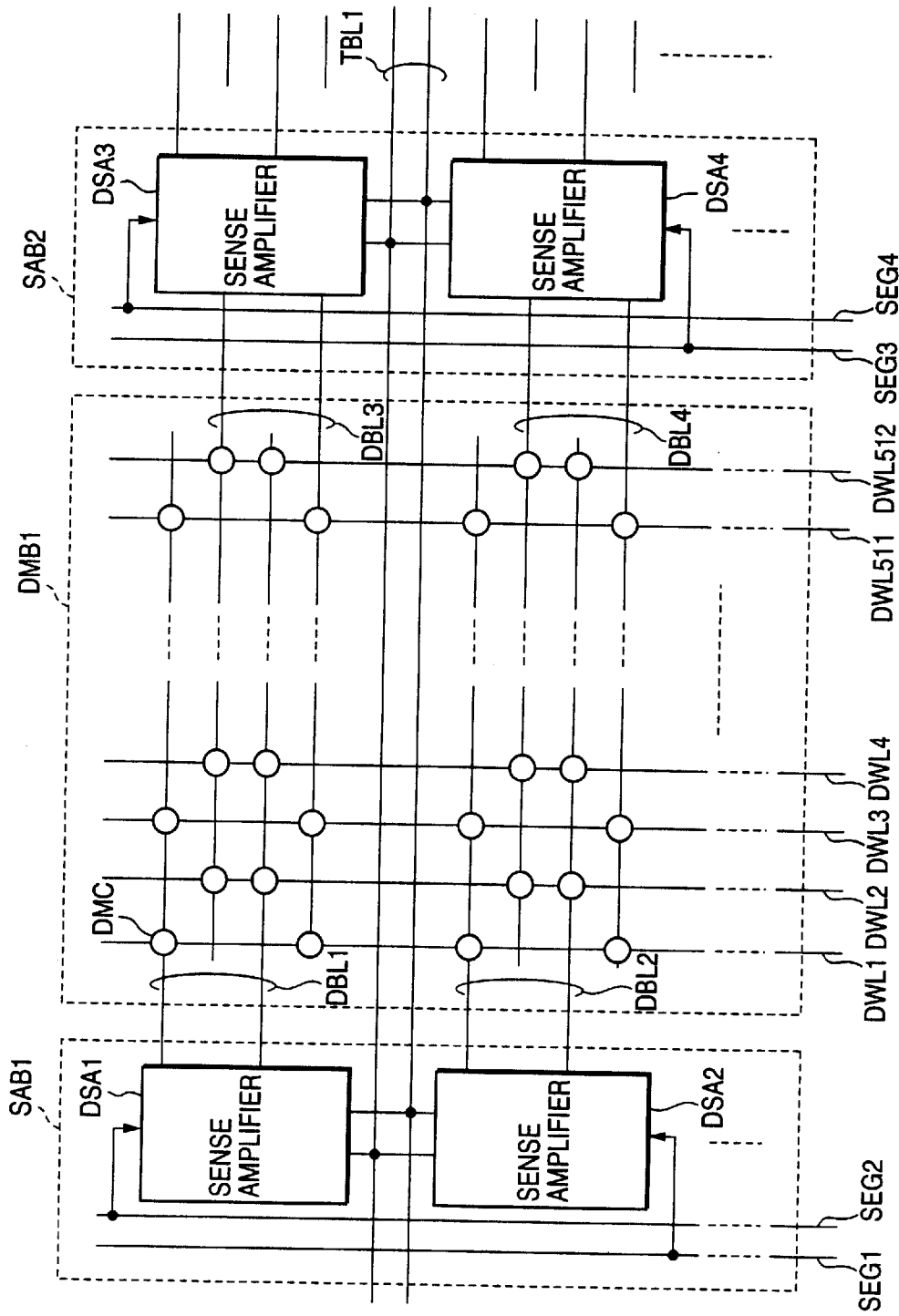
FIG. 3 shows in detail the structure of the region surrounding a memory cell array within main memory, according to the first embodiment of the present invention.

In FIG. 3, an example of the region around data transfer bus line TBL1 in memory cell block DMB1 that forms the memory cell array of main memory 101, and its surrounding regions are shown. As shown in the FIG. 3, data transfer bus line TBL1 is connected to sense amplifiers DSA1 to DSA4, which are alternatingly activated by segment selecting signals SEG1 to SEG4, and which are the 4 sense amplifiers DSA in FIG. 4. Each of these sense amplifiers DSA1 to DSA4 is then connected to its respective corresponding pair of bit lines DBL1 to DBL4, which runs parallel to data transfer bus line TBL1.

Word lines DWL1 to DWL512, which are selectively activated by the main memory row decoder 114 described earlier, are configured perpendicular to the pairs of bit lines DBL1 to DBL4. Memory cells DMC are then formed at the points where word lines DWL1 to DWL512 and the pairs of bit lines DBL1 to DBL4 intersect. If it is noticed that a pair of bit lines is connected to the same sense amplifier, then 512 memory cells DMC are alternatingly connected, and memory cell DMC is laid out as a matrix using the pairs of bit lines DBL1 to DBL4 as repeating units.

On one side of memory cell block DMB1, sense amplifier block SAB1 is placed on sense amplifiers DSA1 and DSA2; and on the other side, sense amplifier block SAB2 is placed on sense amplifiers DSA3 and DSA4. In this example, sense amplifiers DSA3 and DSA4 are placed between two memory cell blocks, and are for common use by the neighboring cell block DMB2 (shared sense amplifier configuration). The other data transfer bus lines TBL2 to TBL1024 and memory cell blocks DMB2 to DMB16 are configured in the same manner; however, only the pair of bit lines on each one of the memory cell blocks is eventually connected to the data transfer bus lines depending on the predetermined row address signal in main memory 101.

Figure 4:
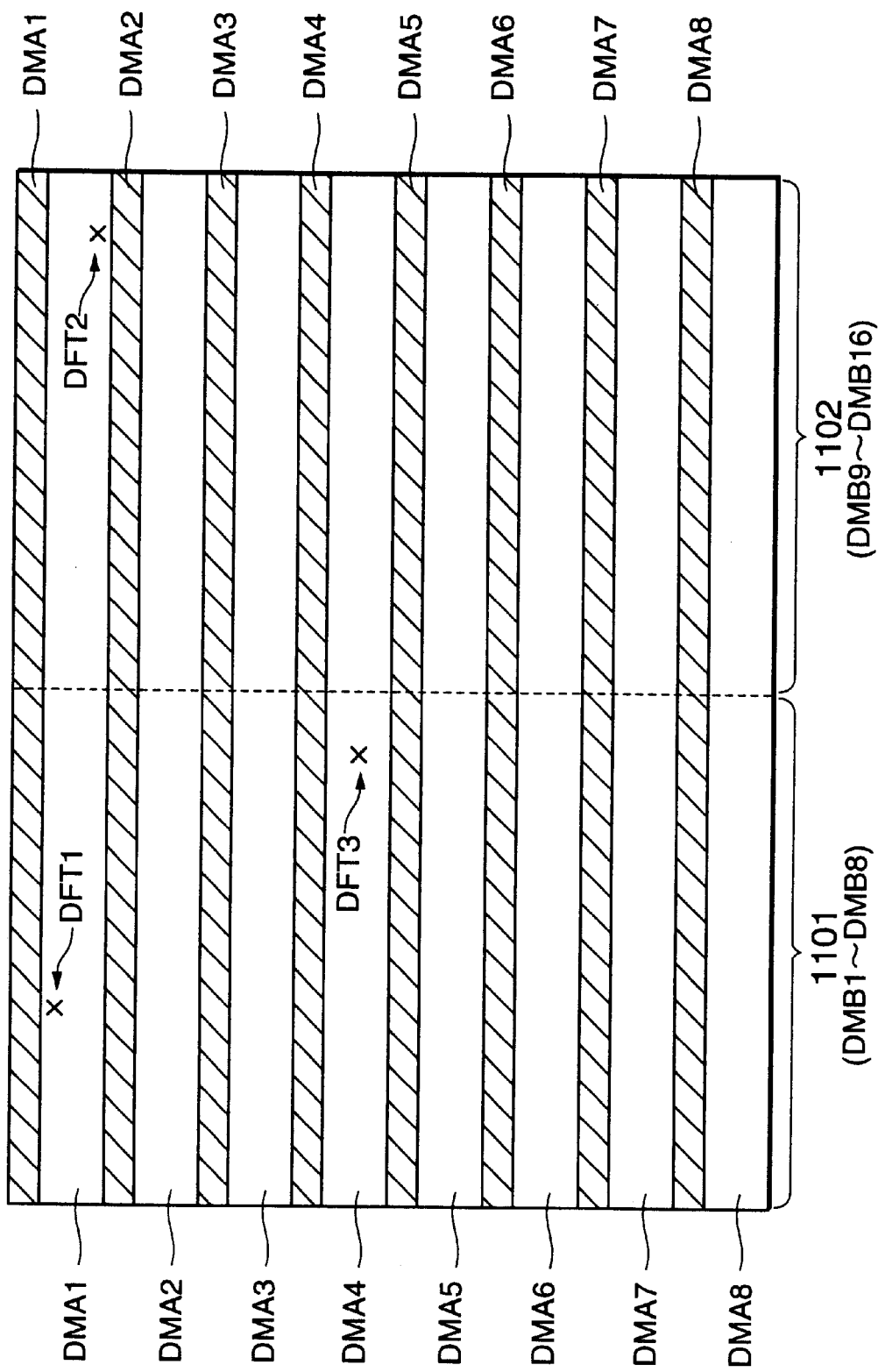
FIG. 4 shows the placement of normal memory cell arrays relative to redundant memory cell arrays within the main memory, according to the first embodiment of the present invention.

FIG. 4 shows the placement of redundant memory cell clusters relative to the normal memory cell clusters in the main memory-memory cell array 110-1. As it is shown in FIG. 4, normal main memory-memory cell arrays DMA1 to DMA8 and redundant main memory-memory cell arrays DMAR1 to DMAR8 are laid out in an alternating pattern in main memory-memory cell array 110-1. Redundant main memory-memory cell arrays DMAR1 to DMAR8 are used to perform defect recovery for defects existing in their respective normal main memory-memory cell array DMA1 to DMA8.

Each respective normal main memory-memory cell array DMA1 to DMA8 is formed from memory cell clusters laid out in a 8192 row by 128 column matrix; and each respective redundant main memory-memory cell array DMAR1 to DMAR8 is formed from redundant memory cell clusters laid out in a 8192 column by 8 column matrix. In addition, in this example, memory cell blocks DMB1 to DMB8 are formed in the region 1101 of main memory 101 that is designated when the main memory row selecting address signal DXn, which is part of the row address signal and which will be explained further later on, is "0"; and memory cell blocks DMB9 to DMB16 are formed in the region 1102 that is designated when main memory row selecting address signal DXn is "1". The other main memory-memory cell arrays 110-2 to 110-4 are formed in the same fashion.

Figure 5:
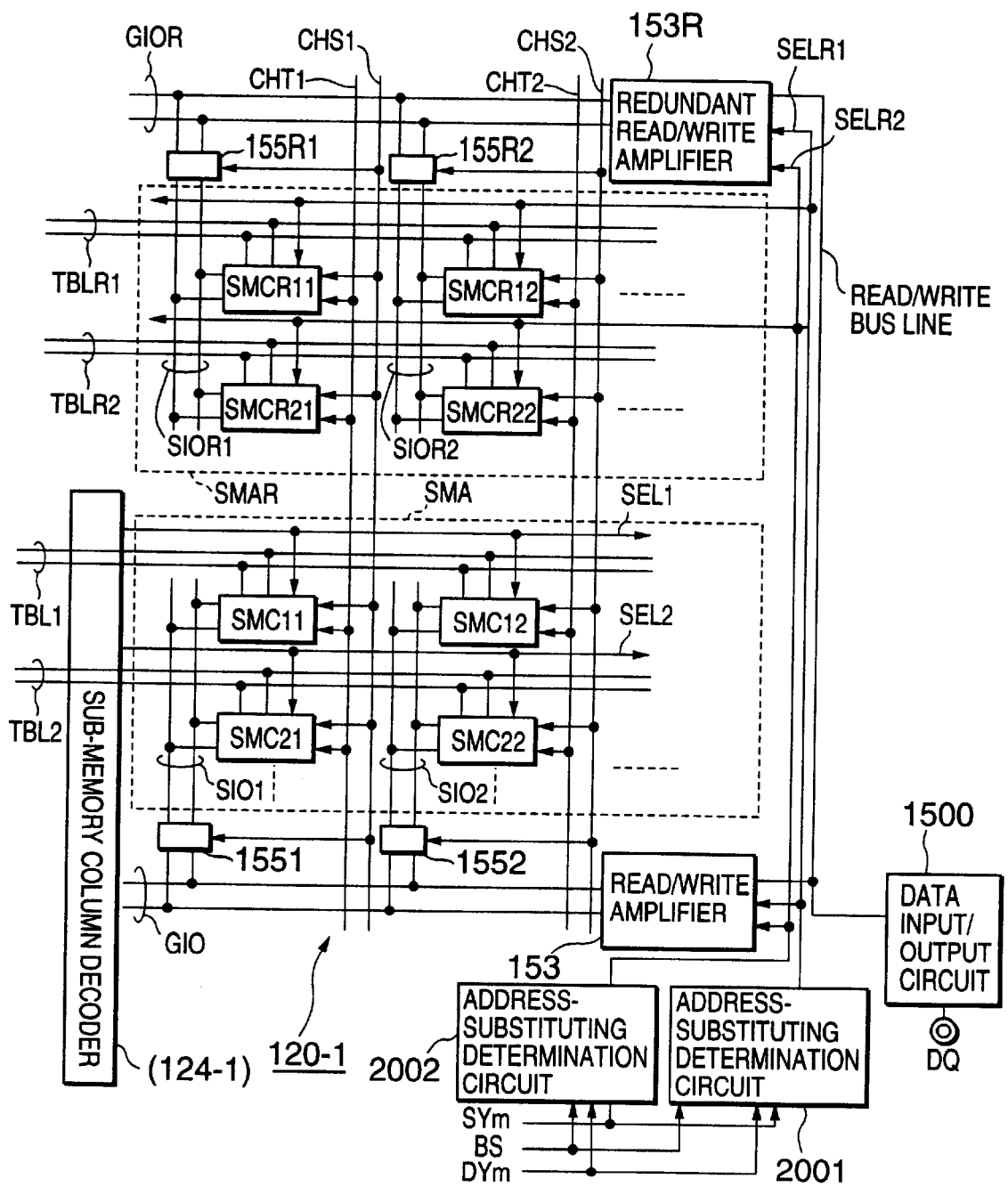
FIG. 5 shows the structure of memory cell arrays forming the sub-memory and the surrounding region, according to the first embodiment of the present invention.

FIG. 5 is an example of sub-memory-memory cell array 120-1 showing the detailed structure surrounding the memory cell arrays in sub-memory 102. However, the example shown in this figure is only one bit out of the ×8 bit structured input/output data DQ0 to DQ7. As shown in FIG. 5, sub-memory-memory cell array 120-1 is comprised of normal sub-memory-memory cell array SMA and redundant sub-memory-memory cell array SMAR.

Normal sub-memory-memory cell array SMA is formed from local data input/output lines SIO (SIO1, SIO2, . . . ), which are laid out approximately perpendicular to data transfer bus lines TBL (TBL1, TBL2, . . . ), and global data input/output lines GIO (GIO1, GIO2, . . . ), which are laid out approximately parallel to data transfer bus lines TBL (TBL1, TBL2, . . . ), with the data input/output lines between it and the external component being layered. Sub-memory-memory cells SMC (SMC11, SMC12, . . . , SMC21, SMC22, . . . ) are connected to data input/output lines SIO (SIO1, SIO2, . . . ); with 64 memory cells being connected to one line of data input/output lines SIO.

Corresponding to data DQ (DQO to DQ7), 8 global data lines GIO are configured (not shown in the figures), and 16 lines of data input/output lines SIO are formed on each global data line GIO. Since 16 memory cells are connected to one data input/output line, the entire sub-memory-memory cell array 120-1 is comprised of memory cells SMC being laid out in a 16 row (the number of data input/output lines SIO connected to one global data line GIO) by 512 column (64×8 bits) matrix. Each memory cell SMC is connected to data transfer bus lines TBL (TBL1, TBL2, . . . ), data input/output lines SIO (SIO1, SIO2, . . . ), sub-memory row selecting-data transfer signals CHT (CHT1, CHT2, . . . ), and sub-memory row selecting-read/write signals CHS (CHS1, CHS2, . . . ).

Each data input/output line SIO is electrically connected to its respective global data input/output line GIO, via data input/output line connection circuits 155 (1551, 1552, . . . ), which are continuously controlled by sub-memory row selecting-read/write signals CHS. Data input/output line connection circuits 155 (1551, 1552, . . . ) are controlled by memory cells SMC together with sub-memory row selecting-read/write signals CHS. Global data input/output lines GIO are connected to read/write amplifier 153, and this read/write amplifier 153 is connected to data input/output circuit 1500 via read/write bus lines.

The redundant sub-memory-memory cell array SMAR is formed adjacent to the normal sub-memory-memory cell array SMA. This redundant sub-memory-memory cell array SMAR is configured by laying out redundant memory cells SMCR (SMCR11, SMCR12, SMCR21, SMCR22, . . . ) in a 16 row by 2 column matrix. Redundant data input/output lines SIOR (SIOR1, SIOR2, . . . ), which correspond to the normal data input/output lines SIO described earlier; redundant data input/output line connection circuits 155R (155R1, 155R2, . . . ), which correspond to data input/output line connection circuits 155 (1551, 1552, . . . ); and redundant global data input/output lines GIOR, which correspond to global data input/output lines GIO are all configured within redundant sub-memory-memory cell array SMAR. Redundant data transfer bus lines TBLR (TBLR1 and TBLR2), redundant data input/output lines SIOR (SIOR1 and SIOR2), sub-memory row selecting-data transfer signals CHT, and sub-memory row selecting-read/write signals CHS are connected to each redundant memory cell SMCR.

Redundant column selecting signals SELR1 and SELR2 are sent to each memory cell SMCR as a column selecting signal for the redundant sub-memory-memory cell array SMAR, from the address-substituting determination circuits 2001 and 2002. In this example redundant column selecting signal SELR1 is sent to redundant memory cells (SMCR11, SMCR12, . . . ), which are connected to redundant data transfer bus line TBLR1; and redundant column selecting signal SEL2 is sent to redundant memory cells (SMCR21, SMCR22, . . . ), which are connected to redundant data transfer bus line TBLR2.

Redundant data input/output lines SIOR (SIOR1, SIOR2, are connected to redundant global data input/output lines GIOR via data input/output line connection circuits 155R (155R1, 155R2, . . . ). Global data input/output lines GIOR are connected to redundant read/write amplifier 153R; this redundant read/write amplifier 153R is connected, together with the read/write amplifier 153 described above, to data input/output circuit 1500 via the read/write bus line.

Address-substituting determination circuits 2001 and 2002 determine which addresses should be replaced by cross-referencing a certain designated address in sub-memory 102 to its corresponding address in main memory 101. More specifically, sub-memory column selecting signals iASC0 to iASC6 (hereafter referred to as sub-memory column selecting signal SYm), which selects certain columns in sub-memory 102; bank address signal iAD13 (hereafter referred to as bank selecting signal BS), which selects a certain bank in main memory 101, and main memory row selecting signal iADR10 (hereafter referred to as main memory row selecting signal DXn), which selects certain rows in main memory 101, are input to address-substituting determination circuits 2001 and 2002, which then generates redundant column selecting signals SELR1 and SELR2.

These redundant column selecting signals SELR1 and SELR2 are applied to the read/write amplifier 153 and redundant read/write amplifier 153R, which were described earlier, in order to control their complementary activation/deactivation. Also, as it was explained earlier redundant column selecting signals SEL1 and SEL2 are each applied to their respective memory cell SMCR formed in the respective column of redundant sub-memory-memory cell array SMAR, selecting certain redundant columns. The structure of address-substituting determination circuits 2001 and 2002 will now be described in more detail.

Figure 6:
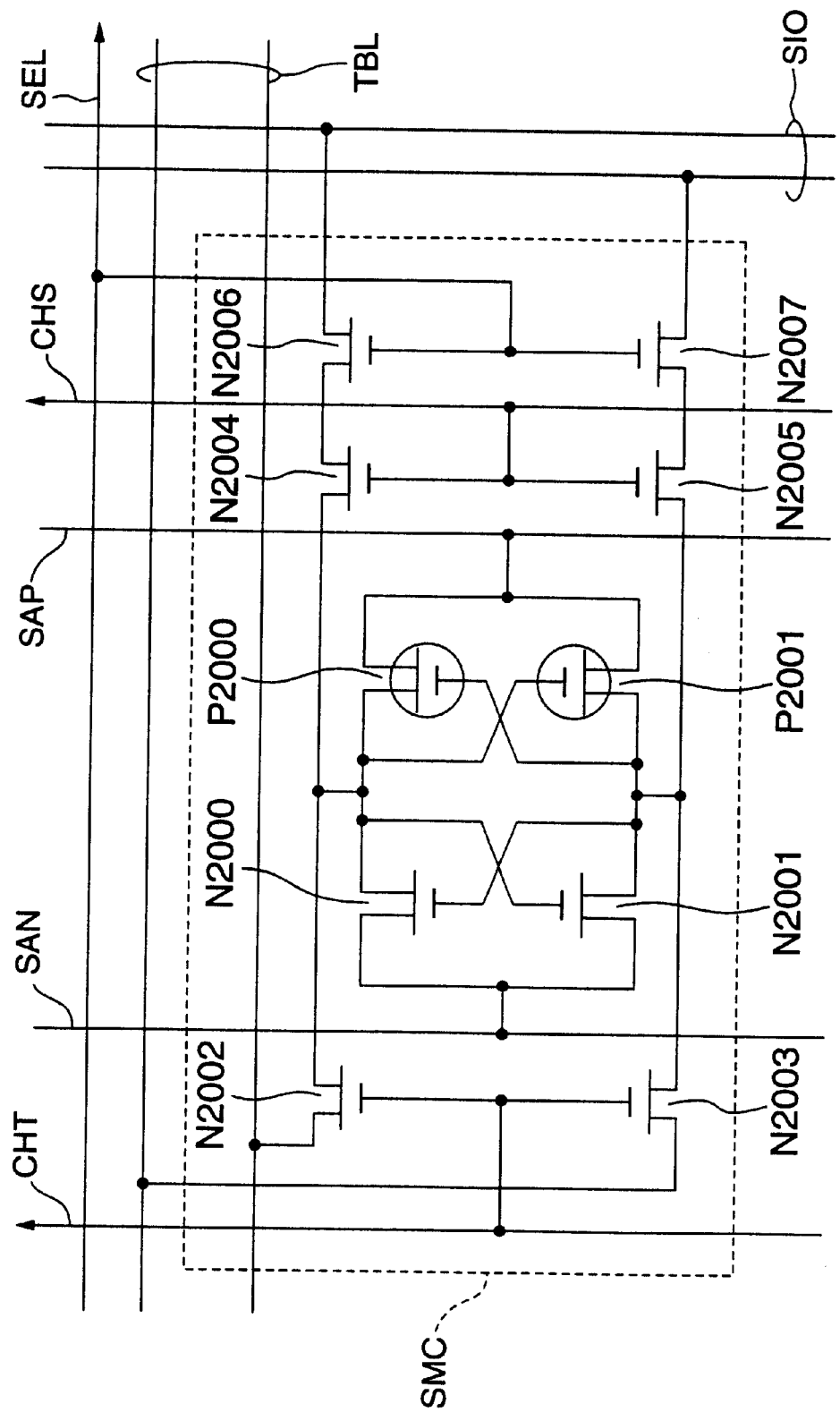
FIG. 6 shows the structure of a memory cell of the sub-memory, according to the first embodiment of the present invention.

FIG. 6 shows the structure of an example of memory cell SMC. The main body of memory cell SMC is formed as a flip-flop, comprising N-channel MOS (NMOS) transistors N2000 and N2001 with their sources connected to control signal SAN, and P-channel MOS (PMOS) transistors P2000 and P2001 with their sources connected to control signal SAP. One pair of memory nodes in this flip-flop is connected to data transfer bus lines TBL via NMOS transistors N2002 and N2003, which are continuously controlled by sub-memory row selecting-data transfer signal CHT. Additionally, another pair of memory nodes in this flip-flop are connected to data input/output lines SIO via NMOS transistors N2006 and N2007, which are continuously controlled by sub-memory column selecting signal SEL, and NMOS transistors N2004 and N2005, which are continuously controlled by sub-memory row selecting-read/write signal CHS.

Sub-memory row selecting-transfer data signal CHT is applied to the gates of NMOS transistors N2002 and N2003, and the connection between the memory nodes in the flip-flop forming memory cell SMC and data transfer bus lines TBL is controlled by this sub-memory row selecting-transfer data signal CHT. Also, sub-memory row selecting-read/write signal CHS is applied to the gates of NMOS transistors N2004 and N2005, sub-memory column selecting signal SEL is applied to the gates of NMOS transistors N2006 and N2007; and according to these signals, the memory cell SMC is selectively connected to data input/output lines SIO.

During read-out/writing of memory cell SMC in sub-memory 102 to/from the external component, certain memory cells SMC, within sub-memory-memory cell array SMA and corresponding to each bit of data DQ0 to DQ7, are first alternatingly selected by sub-memory row selecting-read/write signal CHS, sub-memory column selecting signal SEL, and address signals A0 to A6, A8, A9, A11, A12; and subsequently connected to data input/output lines SIO.

At this point, sub-memory row selecting-read/write signal CHS is connected synchronized with data input/output line connection circuit 155 (one of 1551, 1552, . . . ). Through this, data DQ is written/read into/from the selected memory cell SMC via data input/output lines SIO, data input/output line connection circuit 155, data amplifier 153, and data input/output circuit 1500. This operation is performed for each bit of data DQ0 to DQ7 in order to read/write the 8 bits of data.

In addition, when data is transferred between sub-memory 102 and main memory 101, the 1024 memory cells SMC, which lie in the same row of sub-memory-memory cell arrays 120-1 and 120-2, are simultaneously selected by sub-memory row selecting-data transfer signal CHT and connected to their respective data transfer bus lines TBL1 to TBL1024. In this fashion, sub-memory 102 is formed making it possible to input/output 8 bits of data from/into sub-memory 102 during reading or writing, and making it possible to transfer simultaneously transfer 1024 bits (the amount corresponding to one segment) between it and main memory 101.

Figure 7:
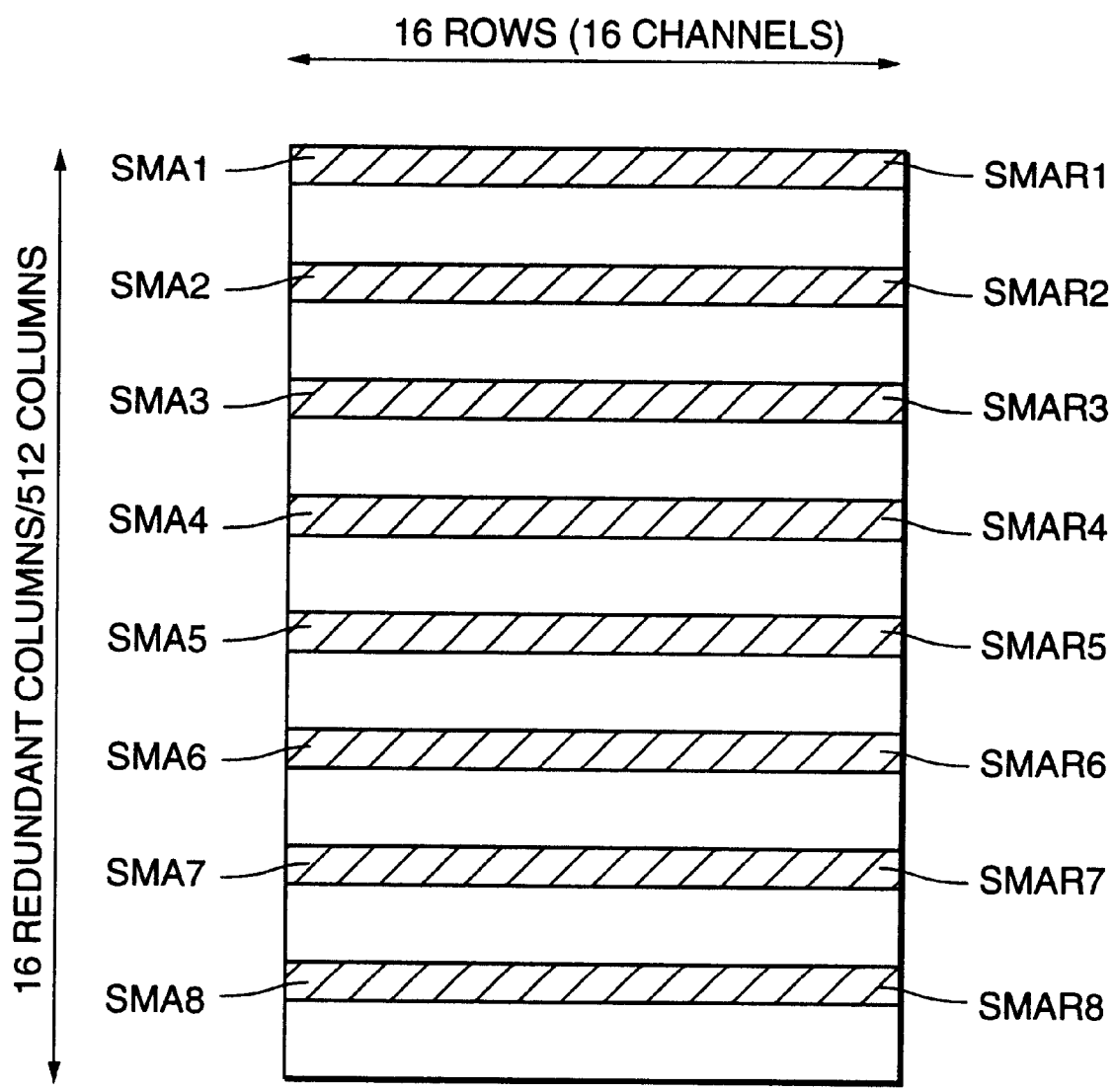
FIG. 7 shows placement of normal memory cell arrays relative to redundant memory cell arrays within the sub-memory, according to the first embodiment of the present invention.

FIG. 7 shows the connections of normal memory cell clusters relative to redundant memory cell clusters in the example of sub-memory-memory cell array 120-1. As shown in this figure, normal sub-memory-memory cell arrays SMAL to SMA8 and redundant sub-memory-memory cell arrays SMAR1 to SMAR8 are alternatingly configured in sub-memory-memory cell array 120-1. Each respective normal sub-memory-memory cell array SMA1 to SMA8 is formed from memory cell clusters laid out in a 16 row by 64 column matrix; and each respective redundant sub-memory-memory cell array SMAR1 to SMAR8 is formed from memory cell clusters laid out in a 16 row by 2 column matrix.

Redundant sub-memory-memory cell arrays SMAR1 to SMAR8 are formed to replace their respective, corresponding normal sub-memory-memory cell array, and are connected to redundant main memory-memory cell arrays DMAR1 to DMAR8 in main memory-memory cell arrays 110-1 and 110-2, via redundant data transfer bus lines TBLR, as described above. Sub-memory-memory cell array 120-2 is structured in the same manner.

Figure 8:
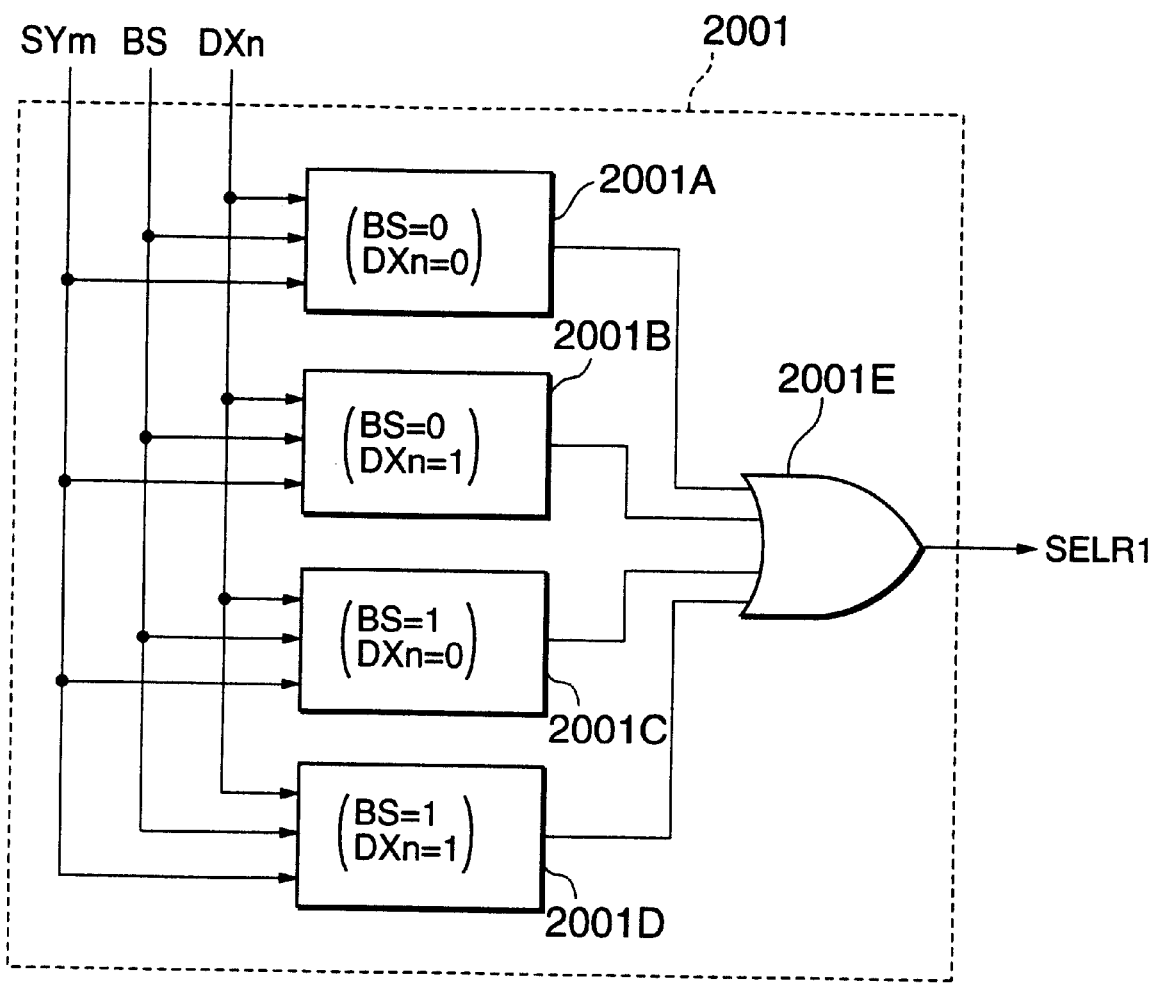
FIG. 8 shows an example of the structure of a determination circuit for determining the address to be replaced, according to the first embodiment of the present invention.

FIG. 8 shows a detailed example of address-substituting determination circuit 2001. As shown in FIG. 8, address-substituting determination circuit 2001 is comprised of address-substituting detectors 2001A to 2001D and OR-gate circuit 2001E. At this point, address-substituting detectors 2001A to 2001D compares a certain pre-programmed address to be substituted (the address that has defect(s)) to the combination of sub-memory column selecting signal SYm, main memory row selecting signal DXn, and bank selecting signal BS, which were described above; and then determines which address in sub-memory 102 should be included in the addresses that have been determined to be the addresses to be substituted in sub-memory 102.

In other words, the address-substituting detector 2001A detects an address to be substituted based on the sub-memory column selecting signal SYm when bank selecting signal BS is "0" and main memory row selecting signal DXn is "0". In the same manner, address-substituting detector 2001B detects when bank selecting signal BS is "0" and main memory row selecting signal DXn is "1"; address-substituting detector 2001C detects when bank selecting signal BS is "1" and main memory row selecting signal DXn is "0"; and address-substituting detector 2001D detects when bank selecting signal BS is "1" and main memory row selecting signal is "1".

The address that shows the location of the defect obtained by testing the semiconductor device beforehand is pre-programmed in the address-substituting detectors 2001A to 2001D; then these address-substituting detectors 2001A to 2001D detect the address to be substituted within the addresses applied from the external component by comparing the pre-programmed address to be substituted to the combination of sub-memory column detecting signal SYm, bank selecting signal BS, and main memory row selecting signal DXn,. The program for the address to be substituted uses, for example, certain fuse circuits familiar to those skilled in the art.

OR-gate circuit 2001E ORs the detected results of each address-substituting detector, and outputs redundant column selecting signal SELR1, which has the logical value (shown in FIG. 8) corresponding to its result. In other words, when any one of the address-substituting detectors 2001A to 2001D detects an address that should be substituted, OR-gate circuit 2001E activates redundant column selecting signal SELR1.

Redundant column selecting signal SELR1 is activated when the combination of sub-memory row selecting signal SYm, bank selecting signal BS, and main memory row selecting signal DXn, which are input to address-substituting determination circuit 2001, match the address to be substituted that is pre-programmed in address-substituting detectors 2001A to 2001D. When this occurs, address-substituting detectors 2001A to 2001D, as it will be described later, determines which address should be substituted according to the location (e.g. bank, memory cell block, etc.) of the defect. If selecting signals SELR1 and SELR2 are activated, then redundant read/write amplifier 153R is activated and normal read/write amplifier 153 is de-activated.

Address-substituting determination circuit 2002 is formed in exactly the same manner as address-substituting determination circuit 2001. Although it is not specifically shown in the figures, address-substituting determination circuits 2001 and 2002 are formed for each of the respective 8 groups of redundant sub-memory-memory cell arrays and normal sub-memory-memory cell arrays shown in FIG. 7.

At this point, when a normal memory cell cluster in sub-memory 102 is replaced with a redundant memory cell cluster, the normal memory cell cluster in main memory 101 that is connected to the normal sub-memory memory cell cluster via data transfer bus lines is replaced with the redundant main memory-memory cell cluster that is connected to the redundant sub-memory-memory cell cluster via the redundant data transfer bus lines; so that if a memory cell cluster is replaced in the sub-memory, then the corresponding main memory-memory cell cluster is also replaced. In other words, according to this embodiment, the memory cell cluster designated by the sub-memory column selecting signal SYm, the main memory row selecting signal DXn, and the bank selecting signal BS is replaced as a unit.

The operation of a redundant circuit, according to this first embodiment, will now be described using an example of when recovery is performed on defects existing in the main memory 101.

Figure 9:
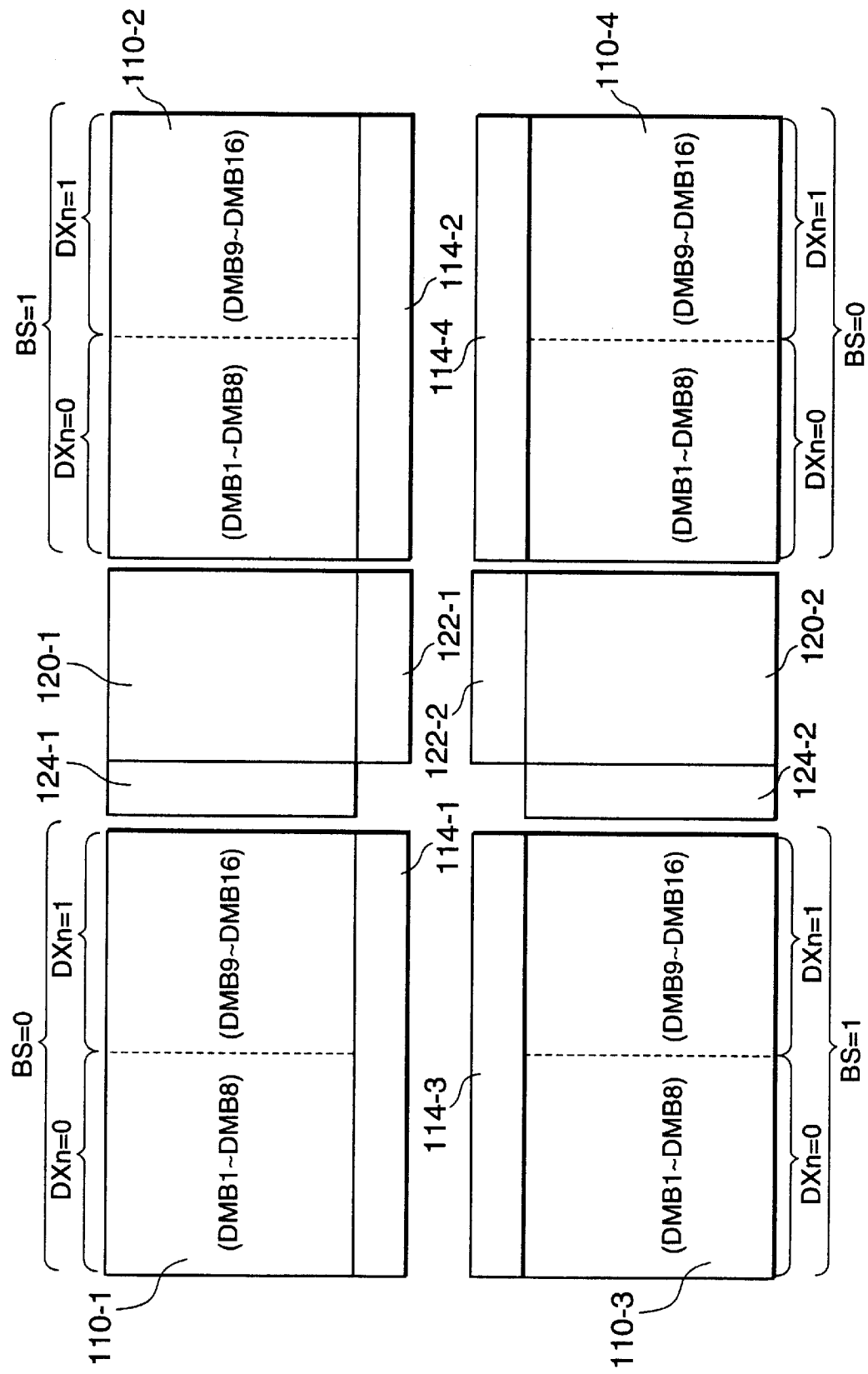
FIG. 9 describes areas that are to be subjected to recovery by the redundant circuit, according to the first embodiment of the present invention.

FIG. 9 shows the region of the main memory-memory cell array designated by bank selecting signal BS and main memory row selecting signal DXn, which have been input to address-substituting determination circuits 2001 and 2002, as described earlier. In this example, a certain bank is designated by bank selecting signal BS, and the region within main memory-memory cell array is designated by main memory row selecting signal DXn. In addition, when bank selecting signal BS is "0", main memory-memory cell arrays 110-1 and 110-4 in bank A are designated; and when bank selecting signal BS is "1", main memory-memory cell arrays 110-2 and 110-3 in bank B are designated. Furthermore, when main memory row selecting signal DXn is "0", the region containing memory cell blocks DMB1 to DMB8 is designated; and when main memory row selecting signal DXn is "1", the region containing memory cell blocks DMB9 to DMB16 is designated.

In this first embodiment, the address to be substituted is determined by referencing sub-memory column selecting signal SYm together with bank selecting signal BS and main memory row selecting signal DXn. This means that when selecting one redundant column, an address to be substituted is determined for each region designated by bank selecting signal BS and main memory row selecting signal DXn; therefore it follows that it is possible to perform recovery for defects existing in a plurality of regions using one redundant column.

The operation of this redundant circuit will now be described in detail. Once the process of setting the address to be substituted has been described, the defect recovery operation will be explained.

1. Process of Setting the Address to be Substituted

By performing assessment testing on semiconductor memory devices beforehand during manufacturing processes, address having defects are extracted as addresses to be substituted. More specifically, column addresses of memory cells in sub-memory 102 has data transfer bus lines TBL in common with memory cells in main memory 101 that have a defect (hereafter referred to as column address to be substituted), addresses designating a bank that have a defect (hereafter referred to as bank address to be substituted), and row addresses in main memory 101 that have a defect (hereafter referred to as row address to be substituted) are extracted as addresses to be substituted. The extracted address to be substituted is set in the address-substituting determination circuits 2001 and 2002 by programming fuse circuits during the manufacturing process.

The process of setting the address to be substituted will now be explained in detail using the defects DFT1 to DFT3 shown in FIG. 4. In the example shown in FIG. 4, defect DFT1 is located in region 1101, within main memory-memory cell array DMA1, which forms main memory-memory cell array 110-1 in bank A. Defect DFT2 is located in region 1102, within the same main memory-memory cell array DMA1 as defect DFT1. Defect DFT3 is located in region 1101, but unlike defects DFT1 and DFT2, within main memory-memory cell array DMA4.

In the case of this example, for example, the address-substituting determination circuit 2001 set up for main memory-memory cell array DMAR1 is set with certain addresses to be substituted for defects DFT1 and DFT2 that are located in the same memory cell array DMA1. More specifically, the address to be substituted for defect DFT1 is set by programming the substitute column address for defect DFT1 in address-substituting detector 2001A, which detects the address to be substituted in region 1101 of bank A. Furthermore, the address to be substituted for defect DFT2 is set by programming the substitute column address for defect DFT2 in address substituting detector 2001B, which detects the address to be substituted in region 1102 of bank A.

The address to be substituted for defect DFT3 located in memory cell array DMA4, which is different from defects DFT1 and DFT2, uses a separate address-substituting determination circuit 2001, which is set up for redundant main memory-memory cell array DMAR4. In this case, the address to be substituted for defect DFT3 is set by programming the substitute column address for defect DFT3 in address substituting detector 2001A, which detects the address to be substituted in region 1101 of bank A.

2. Defect Recovery Operation a. Recovery of Defect DFT1

In FIG. 1, during reading or writing, when internal address signals iA0 to iA6, iA8, iA9, iA11, and iA12 are applied to sub-memory 102, sub-memory operates according to these internal address signals and 8 bits of data is written or read out. While this is ocurring, sub-memory column selecting signals iASC8, iASC9, iASC11, and iASC12 are input to address-substituting detector 2001A in redundant memory cell array SMAR1 as sub-memory column selecting signal SYm, and successively compares the pre-set address to be substituted (the column address to be substituted containing defect DFT1).

At this point, if the address designated by sub-memory column selecting signal SYm matches the column address to be substituted containing defect DFT1 that was set in address-substituting detector 2001A, then address-substituting detector 2001A detects this address as the address to be substituted. OR-gate circuit 2001E receives this and activates redundant column selecting signal SELR1. Once redundant column selecting signal SELR1 is activated, redundant memory cells SMCR (SMCR1, SMACR12, ... ) are selected as items to be accessed by the external component. As a result, of the memory cell clusters in the main memory-memory cell array DMA1, which shares data transfer bus lines with defect DFT1 shown in FIG. 4, only the memory cell cluster which lies within region 1101 is the redundant memory cell cluster that shares data transfer bus line TBLR1 within the redundant main memory-memory cell array DMAR1, and is therefore replaced by the memory cell cluster lying in region 1101. Therefore, of the memory cell clusters sharing data transfer bus lines with the defect DFT1 shown in FIG.4 within main memory-memory cell array DMA1, only the memory cell cluster lying in region 1101 is replaced by the redundant memory cell cluster within the redundant main memory-memory cell array DMAR1 that shares data bus line TBLR1.

b. Recovery of Defect DFT2

In the same manner described above for defect DFT1, sub-memory column selecting signals iASC8, iASC9, iASC11, and iASC12 are input to the same address-substituting detector 2001A in redundant memory cell array SMAR1 as sub-memory column selecting signal SYm, and the column address to be substituted for defect DFT2 is detected by address-substituting detector 2001B. In this case, of the memory cell clusters in the main memory-memory cell array DMAL that share data transfer bus lines with defect DFT1 shown in FIG. 4, only the memory cell cluster lying within region 1102 is the redundant memory cell cluster that shares data transfer bus line TBLR1 within the redundant main memory-memory cell array DMAR1, and is therefore replaced by the memory cell cluster lying in region 1101.

In this example, the column addresses to be substituted for the two defects DFT1 and DFT2 are determined by the same address-substituting determination circuit 2001, and these defects DFT1 and DFT2 are recovered by the redundant memory cell cluster that shares redundant data transfer bus line TBLR1. In other words, one redundant memory cell cluster sharing a data transfer bus line can perform defect recovery for two locations, which accordingly improves the rate of recovery.

c. Recovery of Defect DFT3

In this case, using address-substituting determination circuit 2001 set up for redundant sub-memory-memory cell array SMAR1, in the same manner as with defect DFT1, the address to be substituted for defect DFT3 in the main memory-memory cell array is detected and defect recovery is performed.

As described above, in this first embodiment, if the memory cell cluster that shares one data transfer bus line is defined to equal one column, then each respective redundant main memory-memory cell array DMAR1 to DMAR8 has two columns of redundant memory cell clusters. In addition, normal main memory-memory cell arrays DMA1 to DMA8 and redundant main memory-memory cell arrays DMAR1 to DMAR8 are divided by main memory row selecting signal DXn into two regions: region 1101 and region 1102.

Due to this configuration, using the redundant memory cell clusters that share one redundant data transfer bus line, for example, within memory cell array DMA1, it is possible to perform defect recovery for two locations within two different regions. Furthermore, since each respective normal main memory-memory cell array DMA1 to DMA8 is set up for every two redundant columns, it is possible to perform defect recovery for a total of 128 locations throughout bank A and bank B.

FIG. 10 shows an example of a control settings table of signals to be input from the external component according to each operation during read out and writing. During read-out (Channel read) and writing (Channel write), as an address signal for the external component to access sub-memory 102, original address signals A0 to A6 (column selecting addresses), address signals A10 (row selecting address) and address signal A13 (bank selecting address), which are used when accessing main memory, are set, in addition to address signals A8 and A9 (channel selecting addresses); and using these address signals A10 and A13, address-substituting determination circuits 2001 and 2002 discern banks A and B, and regions 1101 and 1102 of main memory 101.

Figure 11A:
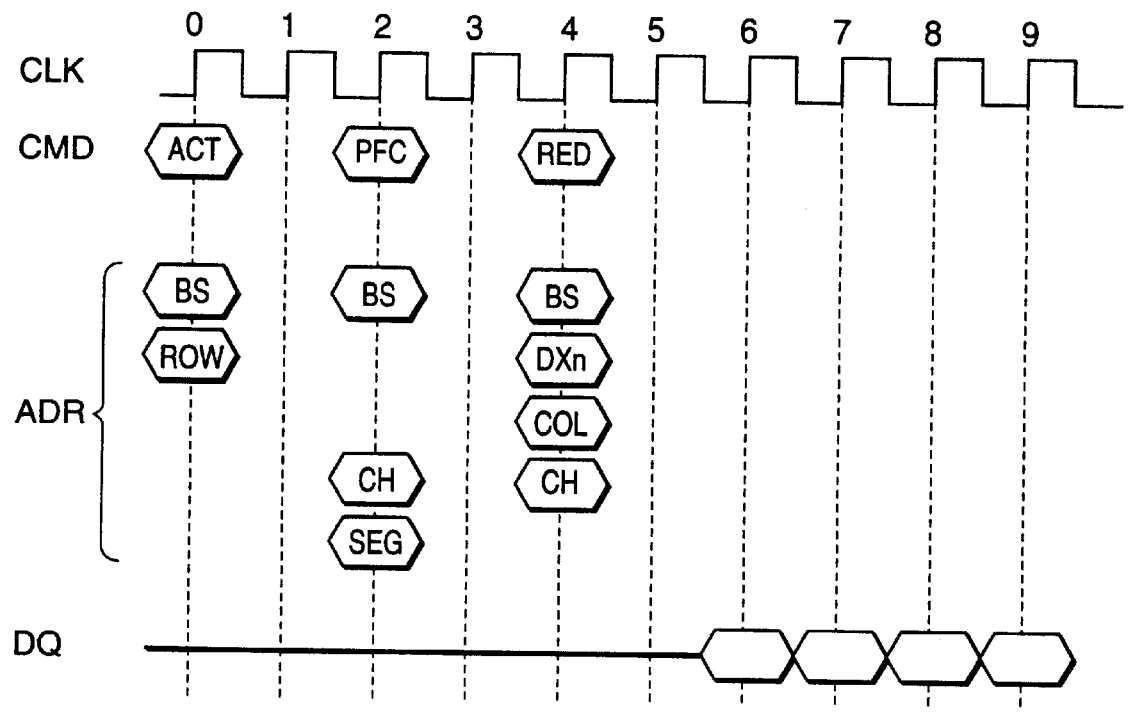
FIGS. 11A and 11B are a timing chart that explains the timing of signals to be input to the sub-memory, according to the first embodiment of the present invention.

FIG. 11 is an example of a timing chart for each signal. As shown in FIG. 11A, with the rising edge of pulse 0 of clock signal CLK, activation command ACT is received as command CMD during read-out, and bank selecting signal BS and signal ROW, which designates a certain row of main memory, are received as address signals ADR, activating a certain bank. With the rising edge of pulse 2 of clock signal CLK, pre-fetch command PFC, bank selecting signal BS, signal CH, which designates a certain row (channel) in sub-memory, and signal SEG, which designates a certain segment in main memory are received; and the data of the segment designated from the bank that was activated is transferred to the designated channel of sub-memory.

Next, with the rising edge of pulse 4 of clock signal CLK, read command RED, bank selecting signal BS, main memory row selecting signal DXn, signal COL, which designates a certain column in sub-memory, and signal CH, which designates a certain row (column) in sub-memory are received. Once these signals are received, via the designated internal operation, data DQ (DQ0 to DQ7) is read out from the designated channel of sub-memory to the external component synchronized to the clock signal CLK. While executing this read command, signals DXn and BS are added signals COL and CH, which are sub-memory address signals, and set. By referencing these signals DXn and BS, defect regions are designated in main memory during read out as described earlier.

Figure 11B:
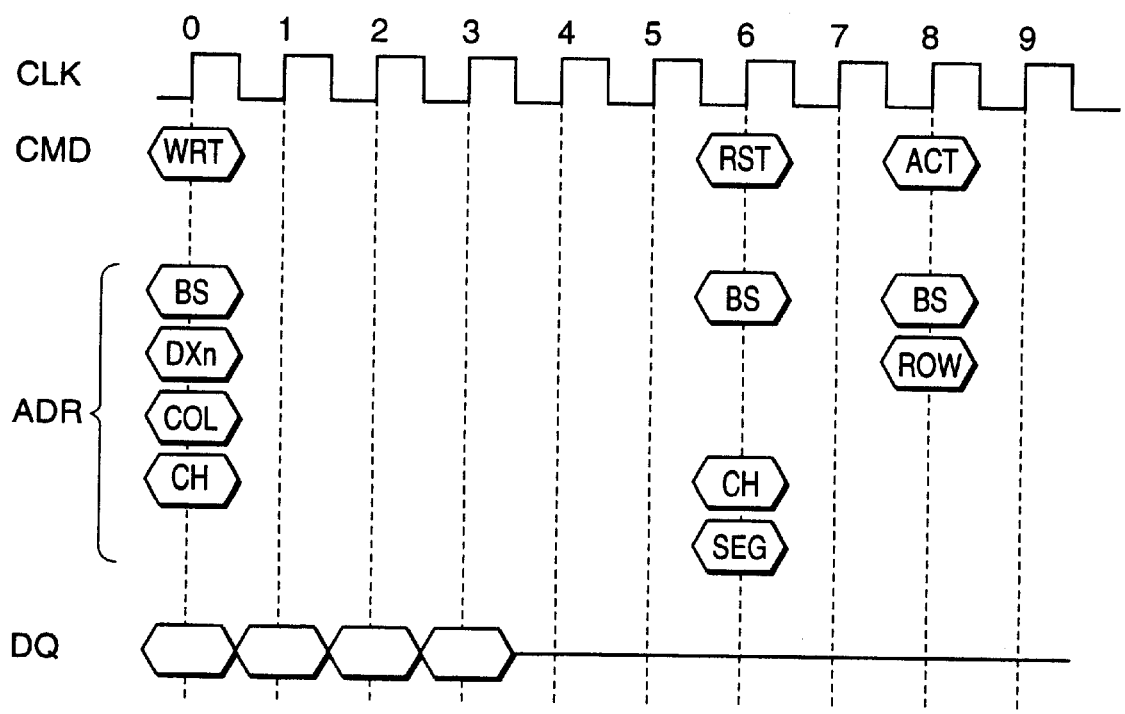

Furthermore, as shown in FIG. 11B, during writing, with the rising edge of pulse 0 of clock signal CLK, write command WRT is received as a command CMD; and bank selecting address BS, signal DXn, which designates a certain row in main memory, signal COL, which designates a certain column in sub-memory, and signal CH, which designates a certain row (channel) in sub-memory are received as address signals. Data DQ is then received by the sub-memory from the external component, synchronous with the clock signal CLK. While executing this write command, signals DXn and BS, which are part of the address signal for main memory, are added to signals COL and CH, which are address signals for sub-memory and set. By referencing these signals DXn and BS, defect regions are designated in main memory during writing as described earlier.

With the rising edge of pulse 6 of clock signal CLK, restore command RST, signal BS, which designates a certain bank, signal CH, which designates a certain row in sub-memory, and signal SEG, which designates a certain segment in main memory, are received. Next, with the rising edge of pulse 8 of clock signal CLK, activation command ACT, bank selecting signal BS, and signal ROW, which designates a certain row in main memory are received.

In addition, in this first embodiment, signal iADR10, which selects a certain row in main memory 101, is used for main memory row selecting signal DXn, however the present invention is not limited to this. For example, memory cell clusters which share data transfer bus lines and are memory cell clusters set up in main memory 101 can be split up into a plurality of groups, and an address signal that designates any one of said plurality of groups may also be used. It is also possible to use, for example, segment address signals iADC0 or iADC1, as main memory row selecting signal DXn, and furthermore, it is also possible to use only main memory row selecting signal iADR10.

(Second Embodiment)

Figure 12:
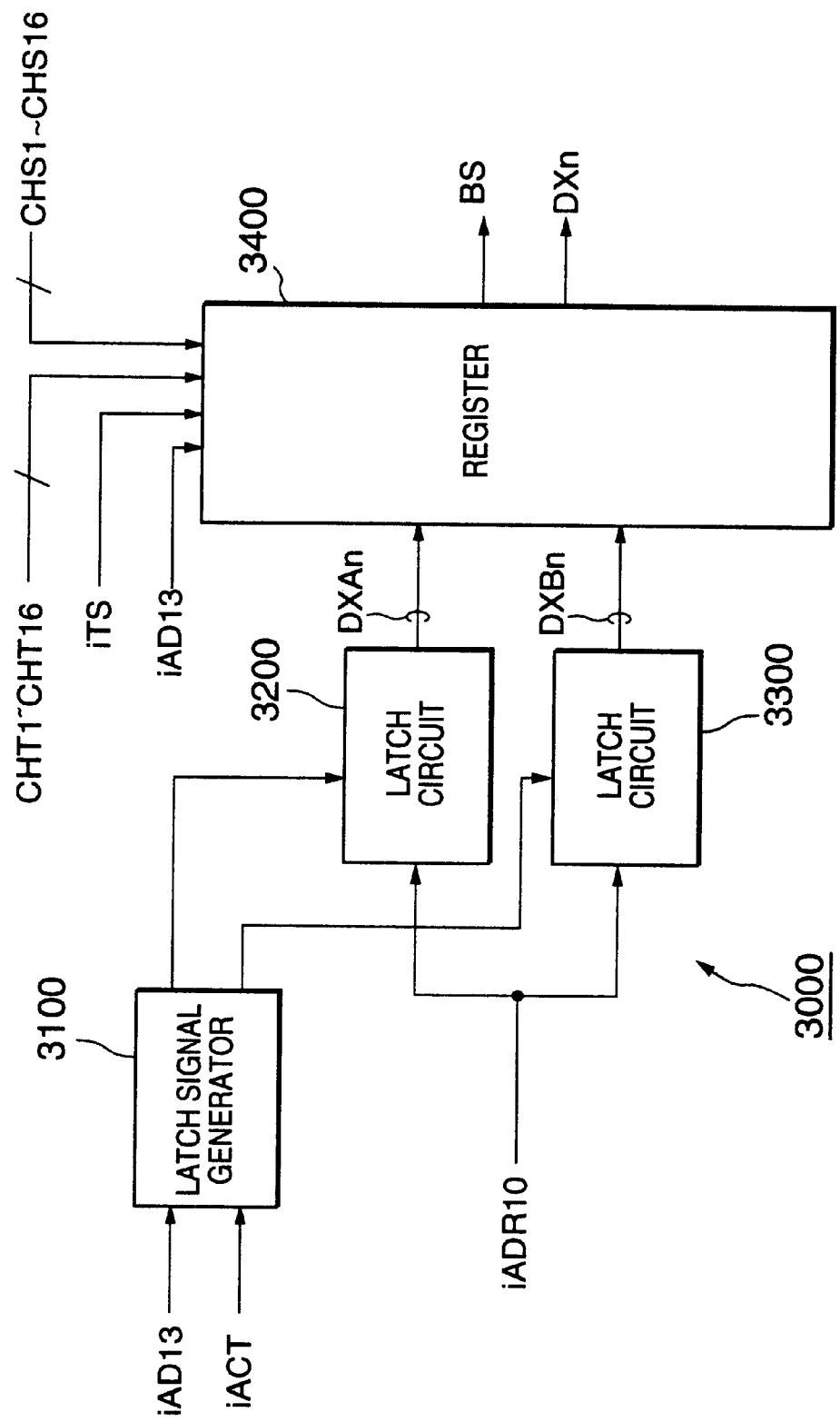
FIG. 12 is a block diagram showing the structure of a main memory-address information hold circuit according to a second embodiment of the present invention.

The second embodiment will now be described. The semiconductor memory device, according to the second embodiment of the present invention, is added to the structure of device, according to the first embodiment of the present invention, and is comprised of a main memory address information hold circuit for holding bank selecting signal BS, and main memory row selecting signal, which are addresses in main memory, in each channel. FIG. 12 shows the structure of main memory address information hold circuit 3000. As shown in FIG. 12, main memory address information hold circuit 3000 is comprised of latch signal generating circuit 3100, latch circuits 3200 and 3300, and register circuit 3400.

Latch signal generator 3100 generates a latch signal corresponding to the bank to which was input the internal activation signals, which were generated during the execution of the activation command, and bank address signal iAD13, which is used for selecting a certain bank in main memory 101. Latch circuit 3200 uses the latch signal output from latch signal generator 3100, as described above, as a trigger, latches main memory row selecting signal iADR10, which designates regions 1101 and 1102 in main memory 101, and then outputs this as address DXAn. Latch circuit 3300 uses the latch signal output from latch signal generator 3100 as a trigger, latches main memory row selecting signal iADR10, which is used to designate regions 1101 and 1102 in main memory, and outputs this as address DXBn.

Register circuit 3400, during the execution of the pre-fetch command or restore command (while transferring data), receives and holds bank address signal iAD13 and row addresses DXAn and DXBn of main memory 101, connecting to the channels of sub-memory 102, and then outputs these as bank selecting signal BS and main memory row selecting signal DXn. Sub-memory row selecting-data transfer signals CHT (CHT1 to CHT6), which are for designating certain channels in sub-memory, sub-memory row selecting-read/write signals CHS (CHS1 to CHS1 6), internal transfer signal iTS, bank address signal iAD13, and row address signals DXAn and DXBn, which are latched in latch circuits 3200 and 3300, are all input to this register circuit 3400.

Figure 13:
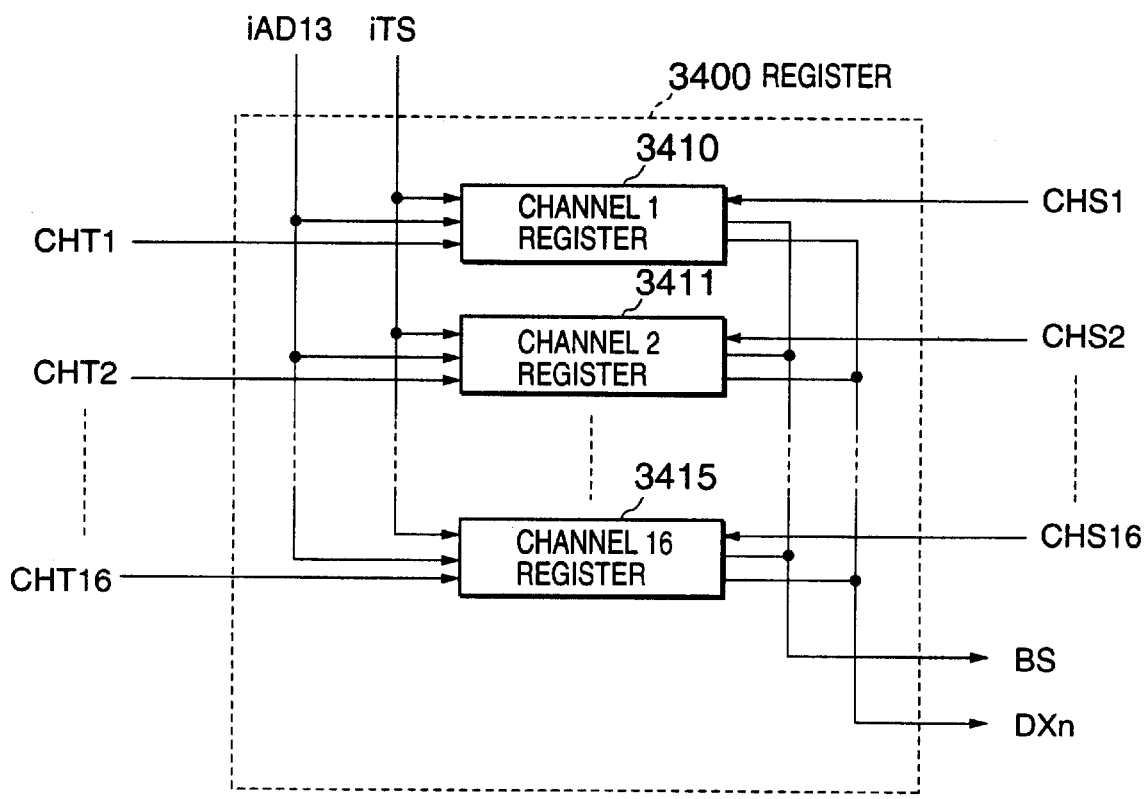
FIG. 13 is a block diagram showing a general overview of the structure of a register circuit within the main memory-address information hold circuit, according to the second embodiment of the present invention.

FIG. 13 shows the structure of register circuit 3400. As shown in FIG. 13, register circuit is comprised of register 3410 for channel 1 through register 3415 for channel 16, which are connected to 16 rows (channels) forming sub-memory-memory cell array 120 described above. Sub-memory row selecting-data transfer signals CHT (CHT1 to CHT16), which select corresponding channels, sub-memory row selecting-read/write signals CHS (CHS1 to CHS16), internal transfer signal iTS and bank address signal iAD13 are input to registers 3410 to 3415. Registers 3410 to 3415 output bank selecting signal BS and main memory row selecting signal DXn to their shared bus lines. Although it is not shown in FIG. 13, row addresses DXAn and DXBn, which are latched by latch circuits 3200 and 3300 as described above, are input together to registers 3410 to 3415.

Figure 14:
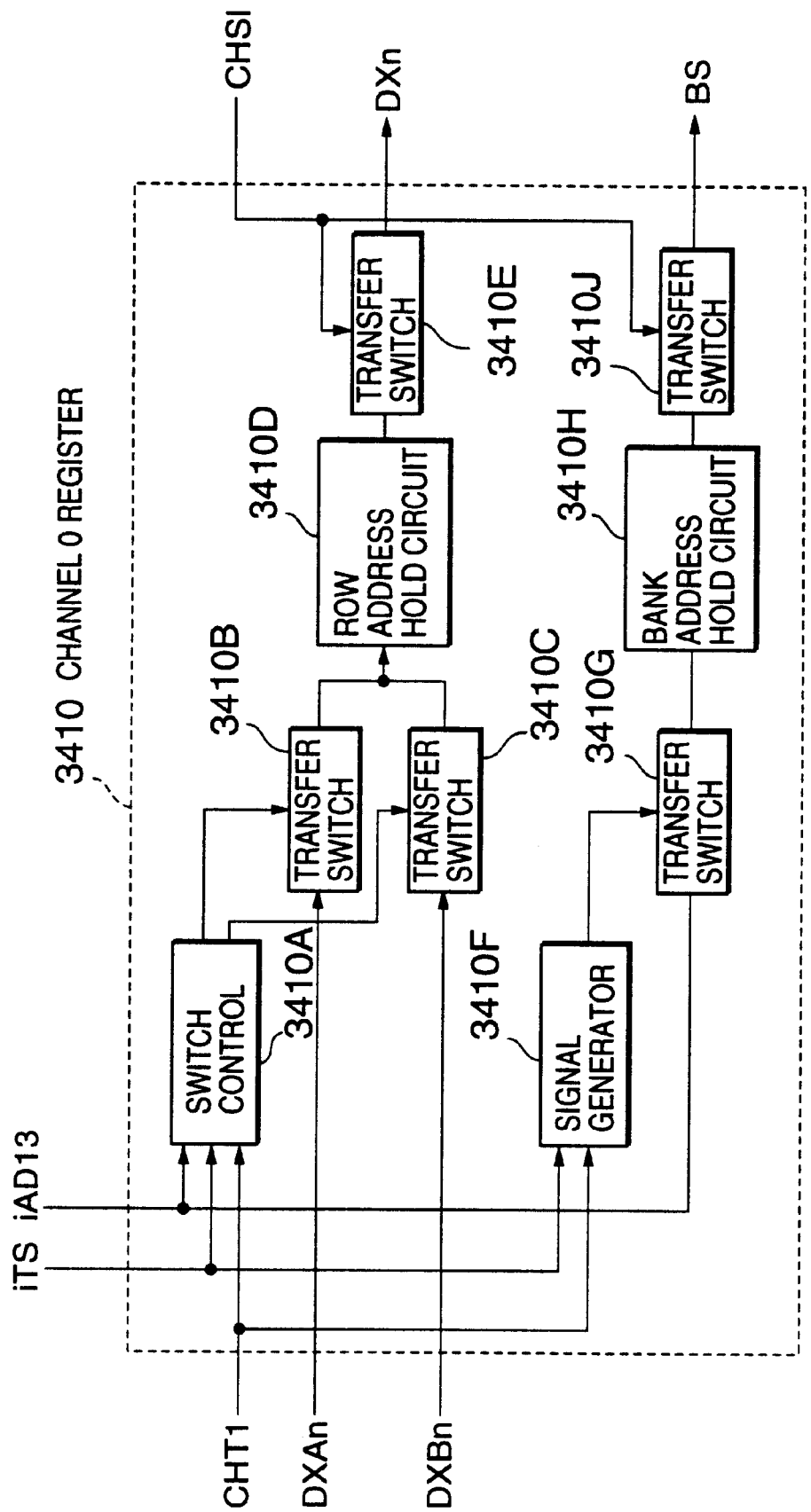
FIG. 14 is a block diagram showing the detailed structure of the register circuit, according to the second embodiment of the present invention.

FIG. 14 shows the structure of each register forming register circuit 3400, using channel 1 register 3410 as an example. As shown in FIG. 14, channel 1 register 3410 is comprised of switch control signal generators 3410A and 3410F, transfer switches 3410B, 3410C, 3410G, 3410E, and 3410J, row address hold circuit 3410D, and bank address hold circuit 3410H.

Switch control signal generator 3410A uses internal transfer signal iTS as a trigger, and generates switch control signals for complementarily controlling transfer switch 3410B and transfer switch 3410C based on bank address signal iAD13 and sub-memory row selecting-data transfer signal CHT1. Transfer switches 3410B and 3410C are formed from, for example, transfer gate transistors, and are continuously controlled based on the switch control signal output from switch control signal generator 3410 described above. Transfer switches 3410B and 3410C transfer each respective row address DXAn and DXBn to row address hold circuit 3410D.

Row address hold circuit 3410D holds row addresses DXAn and DXBn that have been transferred by transfer switches 3410B and 3410C. Transfer switch 3410E is formed from, for example, a transfer gate transistor, is continuously controlled by receiving sub-memory row selecting-read/write signal CHS1, and transfers the row addresses held by row address hold circuit 3410D. The output of this transfer switch 3410E is main memory row selecting signal DXn.

Switch control signal generator 3410F is triggered by internal transfer signal iTS, and generates switch control signals for continuously controlling transfer switch 3410G based on sub-memory row selecting signal CHT1. Transfer switch 3410G is formed from a transfer gate transistor and transfers bank address signal iAD13 to bank address hold circuit 3410H based on the switch control signal output from switch control signal generator 3410F described above.

Bank address hold circuit 3410H holds bank address signal iAD13 that has been transferred by transfer switch 3410G. Transfer switch 3410J is formed from, for example, a transfer gate transistor, is continuously controlled by receiving sub-memory row selecting-read/write signal CHS1, and transfers the bank address signal that is held in bank address hold circuit 3410H. The output of this transfer switch 3410J is bank selecting signal DXn.

Next the operation of the semiconductor memory device, according to this second embodiment, will be described. First, during read out, various signals are input from the external component according to the timing chart shown in FIG. 11A. At this point, in FIG. 11A, with the rising edge of pulse 0 of clock signal CLK, activation command ACT is received, and during the course of activating a certain bank, the latch signal generator 3100 outputs internal activation signal iACT as a latch control signal to latch circuit 3200 or latch circuit 3300 depending on the logic state of band address signal iAD13. This internal activation signal iACT is applied to latch circuit 3200 when bank address signal is "0"; and is applied to latch circuit 3300 when bank address signal is "1".

Depending on the logical value of this latch signal, either latch circuit 3200 or latch circuit 3300 latches main memory row selecting signal iADR10. In other words, if bank address signal iAD13 is "0", main memory row selecting signal iADR10 is latched by latch circuit 3200; on the other hand, if bank address signal iAD13 is "1", main memory row selecting signal IADR10 is latched in latch circuit 3300.

In the example shown in FIG. 9, described earlier according the first embodiment, when bank selecting signal BS was "0", bank A is designated; however, according to this example, it is defined that if bank address signal iAD13 is "0", bank A is designated, and if bank address signal iAD13 is "1", then bank B is designated. According to this definition, main memory row selecting signal DXAn is latched by latch circuit 3200 when bank A is activated; and main memory row selecting signal DXBn is latched by latch circuit 3300 when bank B is activated.

Next in FIG. 11, with the rising edge of clock signal CLK, the pre-fetch command is executed, and data is transferred from the activated bank to certain channels of the sub-memory. During the course of transferring this data, register circuit 3400 shown in FIG. 12 receives and holds bank address signal iAD13, and main memory row selecting signals DXAn and DXBn. In other words, triggered by internal transfer signal iTS, which is generated by executing this pre-fetch command, either of main memory row selecting signal DXAn or DXBn, and bank address signal iAD13 are applied to each register 3410 to 3415 that has been designated by sub-memory row selecting-data transfer signals CH1 to CH16.

The internal operations of each register will now be briefly explained while referencing FIG. 14. It is assumed that register 3410 for channel 0 is currently selected by sub-memory row selecting-data transfer signal CHT1. Switch control signal generator 3410A is triggered by internal transfer signal iTS, and electrically connects to either transfer switch 3410B or transfer switch 3410C based on bank address signal iAD13. At this point, if bank address signal is "0", transfer switch 3410B is electrically connected and main memory row selecting signal DXAn is transferred to address hold circuit 3410D and held.

The main memory row selecting signal DXAn held in this row address hold circuit 3410D is output as main memory row selecting signal DXn via transfer switch 3410E, which is electrically connected during data transfer by sub-memory row selecting-read/write signal CHS1. Supposing that bank address signal iAD13 is "1", then main memory row selecting signal DXBn is applied to row address hold circuit 3410D via transfer switch 3410C, and then output as main memory row selecting signal DXn.

On the other hand, suppose switch control signal generator 3410F is triggered by internal transfer signal iTS and electrically connected to transfer switch 3410F. Accordingly, bank address signal iAD13 is transferred to bank address hold circuit 3410H via transfer switch 3410F and held. Next, this, bank address signal iAD13, which is held in bank address hold circuit 3410H is output during data transfer as bank selecting signal BS together with main memory row selecting signal DXn via transfer switch 3410J, which is electrically connected by sub-memory row selecting-read/write signal CHS1.

Returning once again to the explanation of FIG. 11, next with the rising edge of pulse 4 of clock signal CLK, read command RED is executed and the data in sub-memory 102 is read out to the external component. At this point, main memory row selecting signal DXn, which is a portion of the main memory address signal connected to channel 1, and bank address selecting signal BS applied to address-substituting determination circuits 2001 and 2002 from the main memory address information hold circuit shown in FIG. 14, but not in FIG. 12 described earlier. Next, in the same manner as in the first embodiment, by referencing main memory row selecting signal DXn and bank selecting signal BS, defective regions in main memory are designated and defect recovery is performed.

While executing the read command in this manner, main memory row selecting signal DXn and bank selecting signal BS, which are connected to each channel while executing the activation command and pre-fetch command, and supplied to address-substituting determination circuits 2001 and 2002 while executing the read command, are held in main memory address information hold circuit 3000. However, as with the device according to the first embodiment, it is no longer necessary to input address information to the main memory when accessing channels in sub-memory 102.

Figure 15:
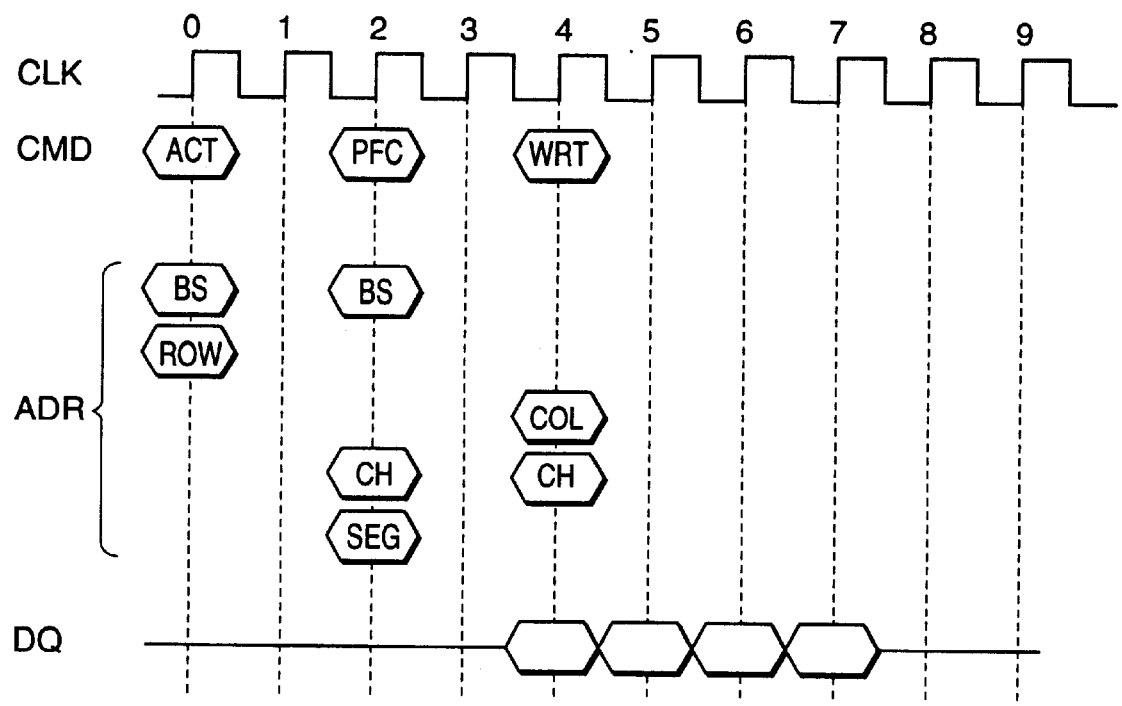
FIG. 15 is a timing chart that explains the timing of signals to be input to the sub-memory, according to the second embodiment of the present invention.

The operations while writing will now be described while referencing FIGS. 15 and 16. As mentioned earlier, during read out, since main memory is accessed beforehand, it is possible to recognize main memory row selecting signal DXn and bank selecting signal BS while reading; however, while writing, it is definitely not possible to access the main memory while in use. Therefore, as shown in FIG. 15, activation command (ACT) and pre-fetch command (PFC) are executed as dummy cycles before a write command (WRT) is executed.

In this dummy cycle, the operations are the same as described earlier in FIG. 11A, main memory row selecting signal DXn and bank selecting signal BS, which are connected to the channel of the item to be written, are held within main memory address information hold circuit 3000. Next, the channel of the item to be written is designated based on sub-memory row selecting signal (CH), which is specified while executing the write command, and main memory row selecting signal DXn and bank selecting signal BS, which are held in the register within main memory address information hold circuit 3000 that is connected to this channel, are applied to the address-substituting determination circuits 2001 and 2002.

Figure 16:
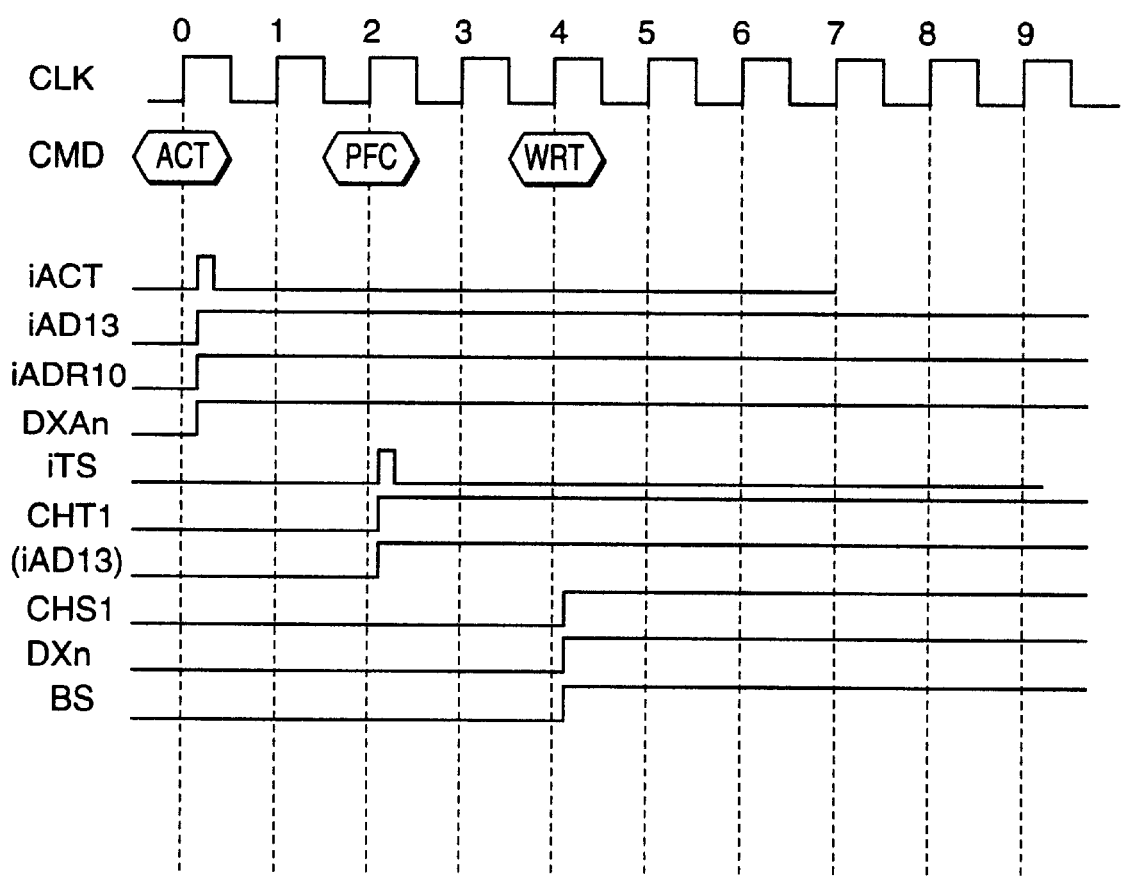
FIG. 16 is a timing chart that explains the operation of the main memory-address information hold circuit, according to the first embodiment of the present invention.

The operation will now be re-explained using the timing chart shown in FIG. 16. While executing the activation command (ACT), bank address signal iAD13 and main memory row selecting signal iADR10 are received by main memory address information hold circuit 3000, and triggered by internal activation signal iACT. In the example shown in FIG. 16, main memory row selecting signal iADR10 is received as main memory row selecting signal DXAn. Then, while executing the pre-fetch command, the internal transfer signal is generated; and triggered by this signal, main memory address information hold circuit 3000 receives bank address signal iAD13. When the write command is then executed, main memory row selecting signal DXn and bank selecting signal BS, which are held within the register of main memory address information hold circuit 3000 that has been designated by sub-memory row selecting-read/write signal CHS1, which is applied to address-substituting determination circuits 2001 and 2002.

The second embodiment of the present invention has been described, however it is to be understood that it is not limited that specified embodiment. For example, in the above embodiment, each main memory-memory cell array has been divided into tow regions 1101 and 1102 by main memory row selecting signal DXn, which is an address in the main memory, however it is not limited to this. It may additionally be split in to a greater number of regions. Through this, it is possible to further improve the rate of recovery by making it possible to further increase the defects that are recovered by using more redundant memory cell clusters sharing one data transfer bus line.

A semiconductor memory device, according to the present invention, has been described in connection with several preferred embodiments. It is to be understood that the subject matter encompassed by the present invention is not limited to that specified embodiment. On the contrary, it is intended to include as many alternatives, modifications, and equivalents as can be included within the spirit and scope of the following claims.

What is claimed is:

1. A semiconductor memory device, which is formed from a main memory, a sub-memory, and a plurality of data transfer bus lines, which are configured so that data can be transferred bi-directionally between said main memory and said sub-memory; comprising a redundant circuit, which determines an address to be substituted by referencing an address in said main memory corresponding to data designated in said sub-memory by an external component during either read-out or writing, and performs defect recovery for defects located in said main memory based on said resultant determination, further comprising: at least one redundant main memory-memory cell array formed in said main memory; at least one redundant sub-memory-memory cell array formed in said sub-memory; redundant transfer data bus lines, which connect said redundant main memory-memory cell array and said redundant sub-memory-memory cell array, and which are configured so that data can be transferred bi-directionally between said redundant main memory-memory cell array and said redundant sub-memory-memory cell array; and, at least one address-substituting determination element, which determines said address to be substituted; wherein said redundant sub-memory-memory cell array is selected based on said resultant determination by said address-substituting determination element.

2. A semiconductor memory device, which is formed from a main memory, a sub-memory, and a plurality of data transfer bus lines, which are configured so that data can be transferred bi-directionally between said main memory and said sub-memory; comprising a redundant circuit, which determines an address to be substituted by referencing an address in said main memory corresponding to data designated in said sub-memory by an external component during either read-out or writing, and performs defect recovery for defects located in said main memory based on said resultant determination, wherein said address in main memory is a memory cell cluster formed in said main memory, which shares said data transfer bus lines, and is divided into a plurality of groups, and which is an address which designates one of said plurality of groups.

3. The semiconductor memory device mentioned in claim 2, wherein said main memory address is an address which selects a certain row in said main memory.

4. The semiconductor memory device mentioned in claim 2, wherein said main memory address is an address which selects a certain bank in said main memory.

5. The semiconductor memory device mentioned in claim 2, wherein said main memory address is an address which selects a certain segment in said memory.

6. A semiconductor memory device, which is formed from a main memory, a sub-memory, and a plurality of data transfer bus lines, which are configured so that data can be transferred bi-directionally between said main memory and said sub-memory; comprising a redundant circuit, which determines an address to be substituted by referencing an address in said main memory corresponding to data designated in said sub-memory by an external component during either read-out or writing, and performs defect recovery for defects located in said main memory based on said resultant determination, further comprising a hold circuit, which holds said main memory address and supplies said main memory address to said redundant circuit.

7. A semiconductor memory device, comprising:
   a main memory cell portion having a plurality of segments, each having plural memory cells, said main memory cell portion being controlled by a first address and having a redundant memory cell;
   a sub memory cell portion having a plurality of channels, each having plural memory cells, said sub memory cell portion being controlled by a second address and having a redundant memory cell, data being transferred between one of said channels and one of said segments; and
   a substituting circuit for substituting one of said redundant memory cells in said main and sub memory cell portions for a defective memory cell, based on a first portion of said first address and a second portion of said second address.

8. The device as claimed in claim 7, wherein said redundant memory cell in said main memory cell portion is coupled to said redundant memory cell in said sub memory cell portion through a redundant transfer data bus line, said sub memory portion including said substituting circuit which substitutes said redundant memory cells in said main and sub memory portions coupled in common to said redundant transfer data bus line for said defective memory cell in said main memory cell portion.

9. The device as claimed in claim 8, wherein said first portion of said first address relates to a row address.

10. The device as claimed in claim 9, wherein said first portion of said first address relates to a bank selection address.

11. The device as claimed in claim 10, wherein said second portion of said second address is a column address.

12. A semiconductor memory device, comprising:
   a main memory cell array including a normal memory cell array and a redundant memory cell array;
   a first control circuit responsive to a first address to select at least one normal memory cell in said normal memory cell array of said main memory cell array;

a sub memory cell array including a normal memory cell array and a redundant memory cell array, said normal memory cell arrays in said main and sub memory cell arrays being electrically connected to each other, said redundant memory cell arrays in said main and sub memory cell arrays being electrically connected to each other;

a second control circuit responsive to a second address to select at least one normal memory cell in said normal memory cell array of said sub memory cell array; and a redundant control circuit which receives a portion of said first address and a portion of said second address for replacing a defective memory cell in said normal memory cell array of said main memory cell array with a redundant memory cell in said redundant memory cell array of said main memory cell array.

13. The device as claimed in claim 12, said device further comprising:

a data transfer bus having a first bus line to electrically connect said normal memory cell in said normal memory cell array of said main memory cell array with said normal memory cell in said normal memory cell array of said sub memory cell array, and having a second bus line to electrically connect said redundant memory cell in said redundant memory cell array of said main memory cell array with a redundant memory cell in said redundant memory cell array of said sub memory cell array, wherein when there is said defective memory cell in said normal memory cell array of said main memory cell array, said redundant control circuit replaces said defective memory cell and said first bus line connected to said defective memory cell with said redundant memory cell in said redundant memory cell array of said main memory cell array and said second bus line connected to said redundant memory cell in said redundant memory cell array.

14. The device as claimed in claim 13, wherein said portion of said first address is a row selection signal.

15. The device as claimed in claim 14, wherein said portion of said first address is a bank selection signal.

16. The device as claimed in claim 15, wherein said portion of said second address is a column selection signal.

17. The device as claimed in claims 16, said device further comprising:

a data input/output circuit which transfers data with an external component;

a first read/write amplifier coupled to said data input/output circuit and said redundant control circuit; and a second read/write amplifier coupled to said data input/output circuit and said redundant control circuit;

wherein said normal cell in said sub memory cell array has two ports, one of said two ports of said normal cell being coupled to said first bus line, the other being coupled to said first read/write amplifier, a redundant cell in said sub memory cell array having two ports, one of said two ports of said redundant cell being coupled to said second bus line, the other of said two ports being coupled to said first read/write amplifier.

18. The device as claimed in claim 16, said device further comprising:

a circuit which latches said portion of said first address in response to at least one of a bank selection signal and an active signal and outputs the latched portion in response to a sub memory row address signal.

19. A semiconductor memory device, comprising:

a main memory cell portion having a normal memory cell array and a redundant memory cell array and receiving a first address in response to a block selection signal, said normal and redundant memory cell arrays being divided into a plurality of regions, each including a part of said normal memory cell array and a part of said redundant memory cell array;

a sub memory cell portion having a normal memory cell array and a redundant memory cell array and receiving a second address;

data capable of being transferred between normal memory cell arrays of said main and sub memory cell portions;

data capable of being transferred between redundant memory cell arrays of said main and sub memory cell portions; and a substituting circuit for determining one of said normal and redundant memory cell arrays to be accessed in said sub memory cell portion in response to at least said block selection signal.

20. The device as claimed in claim 19, wherein at least one normal memory cell in said normal memory cell array and at least one redundant memory cell in said redundant memory cell array of said main memory cell portion are selected in response to said first address, then data stored in the selected normal memory cell and redundant memory cell is transferred and stored into a corresponding normal memory cell in said normal memory cell array and a corresponding redundant memory cell in said redundant memory cell array of said sub memory cell portion, then, data stored in one of said corresponding normal memory cell and said corresponding redundant memory cell is read out in response to said second address including said block selection signal.

21. The device as claimed in claim 20, wherein said second address includes a channel selection signal which selects one of channels divided from said sub memory cell portion.

22. The device as claimed in claim 20, wherein said second address includes a channel selection signal which selects one of channels divided from said sub memory cell portion and a column address for said sub memory cell portion.

23. A method of reading out data from a semiconductor memory device including normal memory cells and redundant memory cells, with substituting a defective memory cell in a main memory cell array by a redundant memory cell, said method comprising:

selecting a plurality of memory cells in said main memory cell array in response to a row address for said main memory cell array;

transferring data stored in memory cells, corresponding to a segment selection signal, among the selected memory cells into memory cells, corresponding to a channel selection signal, in a sub memory cell array; and reading out data stored in memory cells, corresponding to a column address for said sub memory cell array and a block selection signal, among the memory cells corresponding to said channel selection signal, said main memory cell array being divided into a plurality of blocks, said blocks election signal indicating one of said blocks.

* * * * *